US008526257B2

(12) United States Patent
Sutardja et al.

(10) Patent No.: US 8,526,257 B2
(45) Date of Patent: Sep. 3, 2013

(54) PROCESSOR WITH MEMORY DELAYED BIT LINE PRECHARGING

(71) Applicant: Marvell World Trade Ltd., St. Michael (BB)

(72) Inventors: Sehat Sutardja, Los Altos Hills, CA (US); Jason T. Su, Los Altos, CA (US); Hong-Yi Chen, Los Altos Hills, CA (US); Jason Sheu, Cupertino, CA (US); Jensen Tjeng, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 13/657,502

(22) Filed: Oct. 22, 2012

(65) Prior Publication Data

US 2013/0044555 A1 Feb. 21, 2013

Related U.S. Application Data

(63) Continuation of application No. 13/245,551, filed on Sep. 26, 2011, now Pat. No. 8,295,110, which is a continuation of application No. 12/061,296, filed on Apr. 2, 2008, now Pat. No. 8,027,218, which is a continuation-in-part of application No. 11/870,883, filed on Oct. 11, 2007, now Pat. No. 7,787,324.

(60) Provisional application No. 60/829,438, filed on Oct. 13, 2006.

(51) Int. Cl.
*G11C 7/00* (2006.01)

(52) U.S. Cl.
USPC ............... 365/203; 365/233.1; 365/233.11; 711/125; 712/205

(58) Field of Classification Search
USPC ................ 365/203, 233.1, 233.11, 125, 205
See application file for complete search history.

(56) References Cited

U.S. PATENT DOCUMENTS 5,848,015 A 12/1998 Seno
5,848,415 A 12/1998 Guck
(Continued)

FOREIGN PATENT DOCUMENTS

EP A-0427425 5/1991
EP A-1 531 480 8/2006
WO WO 98/06100 2/1998

OTHER PUBLICATIONS

Notification of Transmittal of the International Search Report and the Written Opinion of The International Searching Authority, or the Declaration dated Jul. 22, 2008 in reference to PCT/US2008/004439.

(Continued)

*Primary Examiner* — Alexander Sofocleous
*Assistant Examiner* — Lance Reidlinger

(57) ABSTRACT

A processor includes an array of memory cells, a control module, a precharge circuit, and an amplifier module. The control module generates a clock signal at a first rate, reduces the first rate to a second rate for a predetermined period, and adjusts the second rate back to the first rate at an end of the predetermined period. The precharge circuit: based on the first rate, precharges first bit lines connected to memory cells in a first row of the array of memory cells; based on the second rate, refrains from precharging the first bit lines; and precharges the first bit lines subsequent to the end of the predetermined period. The amplifier module: based on the first rate, access first instructions stored in the first row; and based on the second rate, accesses second instructions stored in the first row or a second row of the array.

20 Claims, 18 Drawing Sheets

(56) References Cited

U.S. PATENT DOCUMENTS

| | | | |
|---|---|---|---|
| 5,942,284 | A | 8/1999 | Hiskes et al. |
| 5,943,284 | A | 8/1999 | Mizuno et al. |
| 7,460,432 | B2 | 12/2008 | Warner |
| 7,471,574 | B2 | 12/2008 | Park |
| 7,477,570 | B2 | 1/2009 | Warner |
| 2003/0196044 | A1 | 10/2003 | Ramirez et al. |
| 2005/0149708 | A1 | 7/2005 | Gat et al. |
| 2006/0101207 | A1 | 5/2006 | Nakazato |
| 2006/0101217 | A1 | 5/2006 | Maki et al. |
| 2006/0174090 | A1 | 8/2006 | Sartorius et al. |
| 2009/0122629 | A1 | 5/2009 | Warner |

OTHER PUBLICATIONS

Notification of Transmittal of the International Preliminary Report on Patentability including Written Opinion of the International Searching Autohrity regarding PCT/US2007/021796 dated Feb. 27, 2008.

ANSI/IEEE Std 802.11, 1909 Edition; Information Technology—Telecommunications and exchange between systems—Local and metropolitan area networks—Specific requirements—Part 11: Wireless LAN Medium Access Control (MAC) and Physical Layer (PHY) Specifications; LAN/MAN Standards Committee of the IEEE Computer Society; 531 pgs.

IEEE P802.11g/D8.2, Apr. 2003 (Supplement to ANSI/IEEE Std 802.11-1999 (Reaff 2003): DRAFT Supplement to Standard [for] Information Technology—Telecommunications and information exchange between systems—Local and metropolitan areat networks—Specific requirements—Part 11: Wireless LAN Medium Access Control (MAC) and Physical Layer (PHY) Specifications; Further Higher Data Rate Extension in the 2.4 GHz Band; LAN/MAN Standards Committee of the IEEE Computer Society; 69 pgs.

IEEE 802.11n; IEEE 802.11-04/0889r6; IEEE P802.11 Wireless LANs; TGn Sync Proposal Technical Specification; May 2005; 131 pgs.

IEEE Std 802.11a-1000 (Supplement to IEEE Std 802.11-1999); Supplement to IEEE Standard for Information Technology—Telecommunications and information exchange between systems—Local and metropolitan area networks—Specific requirements—Part 11: Wireless LAN Medium Access Control (MAC) and Physical Layer (PHY) Specifications: High-speed Physical Layer in the 5GHz Band; LAN/MAN Standard Committee of the IEEE Computer Society; Sep. 16, 1999, 91 pgs.

IEEE Std 802.11b-1999 (Supplement to IEEE Std 802.11-1999 Edition) Supplement to IEEE Standard for Information Technology—Telecommunications and information exchange between systems—Local and metropolitan area networks—Specific requirements—Part 11: Wireless LAN Medium Access Control (MAC) and Physical Layer (PHY) Specifications: Higher-Speed Physical Layer Extension in the 2.4 GHz Band; LAN/MAN Standard Committee of the IEEE Computer Society; Sep. 16, 1999 IEEE—SA Standards Board; 96 pgs.

IEEE Std 802.16/2004 (Revision of IEEE Std 802.16/2001) IEEE Standard for Local and metropolitan area networks; Part 16; Air Interface for Fixed Broadband Wireless Access Systems; IEEE Computer Society and the IEEE Microwave Theory and Techniquest Society; Oct. 1, 2004; 893 pgs.

IEEE Std 802.11h-2003 [Amendment fo IEEE Std 802.11, 1999 Edition (Reaff 2003) as amended by IEEE Stds 802.11a-19099, 802.11b-1999, 80211b-1999/Cor 1-2001, 802.11d-1001, 802.11g-2003]; IEEE Standard for Information Technology—Telecommunications and Information exchange between systems—Local and metropolitan area networks—Specific requirements—Part 11: Wireless LAN Medium Access Control (MAC) and Physical Layer (PHY) Specifications; Amendment 5: Spectrum and Transmit Power Management Extensions in the 5GHz band in Europe; IEEE Computer Society; LAN/MAN Standards Committee; Oct. 14, 2003; 75 pgs.

IEEE 802.20-Pd-06; IEEE p. 802.20 V 14; Jul. 16, 2004; Draft 802.20 Permanent Document; System Requirements for IEEE 802.20 Mobile Broadband Wireless Access Systems—Version 14; 24 pgs.

Specification of the Bluetooth System—Specification vol. 0; Master Table of Contents and Compliance Requirements; Covered Core Package versions: 2.0+EDR; Current Paster TOC issued: Nov. 4, 2004; Part A, pp. 1-74, vol. 1, pp. 1-92, vols. 2 & 3, pp. 1-814; vol. 4, pp. 1-250.

PROCESSOR WITH MEMORY DELAYED BIT LINE PRECHARGING

CROSS-REFERENCE TO RELATED APPLICATIONS

This application is a continuation of U.S. patent application Ser. No. 13/245,551 (now U.S. Pat. No. 8,295,110), filed Sep. 26, 2011, which is a continuation of U.S. patent application Ser. No. 12/061,296 (now U.S. Pat. No. 8,027,218), filed Apr. 2, 2008, which is a continuation-in-part of U.S. patent application Ser. No. 11/870,833 (now U.S. Pat. No. 7,787,324), filed Oct. 11, 2007, which claims the benefit of U.S. Provisional Application No. 60/829,438, filed Oct. 13, 2006. The entire disclosures of the above applications are incorporated herein by reference.

FIELD

The present disclosure relates to processors, and more particularly to processor and memory access techniques.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Memory in computing devices may be arranged in a memory hierarchy, which includes memory devices of different speeds, types and sizes. The type, size and proximity of a memory device to a processor affect processing speed of the memory device. Higher levels of the hierarchy generally correspond to higher speed/lower capacity memory devices while lower levels of the hierarchy generally correspond to lower speed/higher capacity devices. For example, cache may be at the highest level, RAM and ROM may be at middle levels, and non-volatile memory such as a hard disk drive may be at the lowest level.

Cache may be used to store copies of highly used data and instructions to improve performance. The cache may be implemented using high speed memory such as static random access memory (SRAM) instead of slower dynamic RAM (DRAM), which may be used for main memory. The cache may be arranged on the same integrated circuit (IC) as the processor and may be referred to as Level 1 (L1) cache.

During operation, the processor executes instructions. More particularly, the processor fetches an instruction having a location identified by a program counter (PC). After fetching the instruction, the processor decodes the instruction, which may include an opcode and an operand. The opcode indicates the operation to be performed while the operand may include information for the operation to be performed. After the fetch and decode steps are performed, the processor executes the instruction. Finally, the processor writes back the results to memory. After completing the instruction, the program counter may be incremented by the length of the instruction word.

Some types of instructions may be called branches or jumps that may be used to directly manipulate the program counter. For example, the branch may be used to facilitate behavior similar to loops, conditional decisions and other program functions. Alternately, the branch may occur as a result of register values, which may represent flags.

The cache may be accessed as a word; each including R instructions, where R is an integer greater than one. Each instruction may include I bits, where I is an integer greater than one. To access the word of instructions, multiple read cycles may be executed. Each read cycle accesses one of the instructions. During the read cycle, memory cells associated with an instruction are accessed by asserting toggling both a row path (a word line) and multiple column paths (bit lines) of the array for the corresponding instruction. The asserting of row and column paths may be accompanied by decoding row and column addresses, generating a word line signal, precharging bit lines, sensing-amplification of stored bit information, and latching data.

SUMMARY

A processor is provided and includes a memory, a control module, a precharge circuit, and an amplifier module. The memory includes an array of memory cells. The control module is configured to generate a clock signal at a first rate, reduce the first rate of the clock signal to a second rate for a predetermined period, and adjust the clock signal from the second rate back to the first rate at an end of the predetermined period. The precharge circuit is configured to: based on the clock signal at the first rate, precharge first bit lines connected to memory cells in a first row of the array of memory cells; based on the clock signal at the second rate, refrain from precharging the first bit lines during the predetermined period; and precharge the first bit lines subsequent to the end of the predetermined period. The amplifier module is configured to: based on the clock signal at the first rate, access first instructions stored in the first row of the array of memory cells; and based on the clock signal at the second rate, accesses second instructions stored in the first row of the array of memory cells or in a second row of the array of memory cells.

A method includes generating a clock signal at a first rate; reducing the first rate of the clock signal to a second rate for a predetermined period; and adjusting the clock signal from the second rate back to the first rate at an end of the predetermined period. Based on the clock signal at the first rate, first bit lines connected to memory cells in a first row of an array of memory cells are precharged. The method further includes based on the clock signal at the second rate, refraining from precharging the first bit lines during the predetermined period. The first bit lines are precharged subsequent to the end of the predetermined period. Based on the clock signal at the first rate, first instructions stored in the first row of the array of memory cells are accessed. Based on the clock signal at the second rate, second instructions stored in the first row of the array of memory cells or in a second row of the array of memory cells are accessed.

In general, in one aspect, the present disclosure describes a processor including a cache memory, a decoder, a precharge circuit, a control module, and an amplifier module. The cache memory includes an array of memory cells. The decoder generates a first word line signal to access first instructions stored in a first word line of the array of memory cells, and (ii) generates a second word line signal to access second instructions stored in the first word line or a second word line of the array of memory cells. The precharge circuit (i) precharges first bit lines connected to the first word line during a first precharge event and prior to accessing the first instructions, and (ii) precharges the first bit lines during a second precharge event and prior to accessing the second instructions. The second precharge event is subsequent to the first precharge event. The control module adjusts a rate of a clock signal from a first rate to a second rate during the first precharge event. The amplifier module accesses the first instructions based on (i) the first word line signal and (ii) the clock signal at the first rate, and accesses the second instructions based on (i) the second word line signal and (ii) the clock signal at the second rate.

In general, in another aspect, the present disclosure describes a method including: generating a first word line signal to access first instructions stored in a first word line of an array of memory cells of a cache memory, generating a second word line signal to access second instructions stored in the first word line or a second word line of the array of memory cells, precharging first bit lines connected to the first word line during a first precharge event and prior to accessing the first instructions, precharging the first bit lines during a second precharge event and prior to accessing the second instructions. The second precharge event is subsequent to the first precharge event.

The method further includes: adjusting a rate of a clock signal from a first rate to a second rate during the first precharge event, accessing the first instructions in response to the first word line signal and based on the clock signal at the first rate, and accessing the second instructions in response to the second word line signal and based on the clock signal at the second rate.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
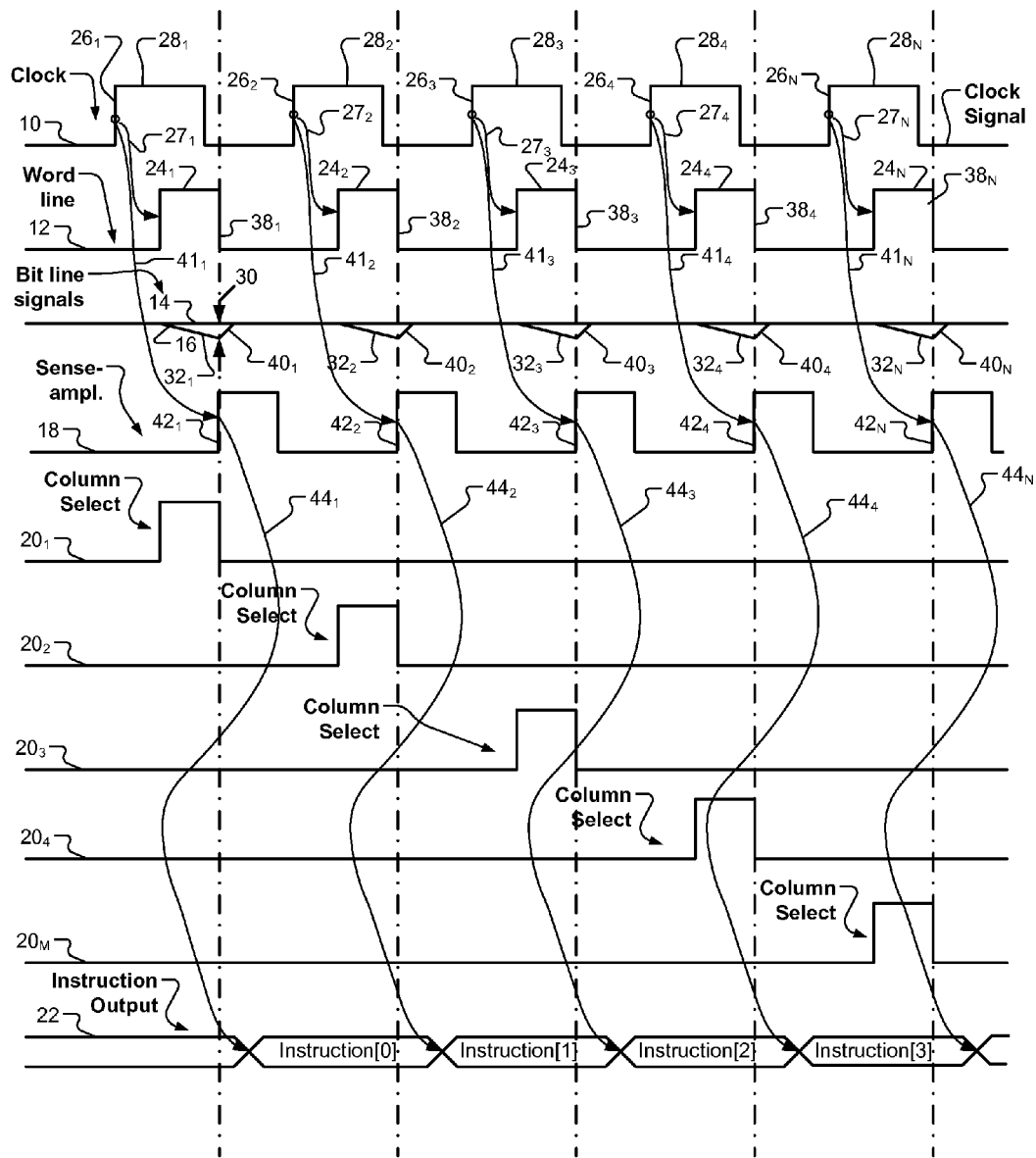
FIG. 1 is a signal timing diagram illustrating operation of a discrete read access system for a processor memory.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module may refer to an Application Specific Integrated Circuit (ASIC), an electronic circuit, a processor (shared, dedicated, or group) and memory that execute one or more software or firmware programs, a combinational logic circuit, and/or other suitable components that provide the described functionality. A processor may refer to a logic circuit that processes stored instructions.

In the following description, the terms assert and assertion may refer to the transitioning of a signal line from a first state to a second state. For example, a signal line may be transitioned from a LOW state to a HIGH state or vice versa. The terms assert and assertion may also refer to the enabling of one or more cells or cell lines for cell selection. The cell lines may include word lines or bit lines.

In addition, many variables are disclosed herein. A variable used in one implementation may have a different meaning in a different implementation or context. For example, the variable T may refer to a transistor, to time, or to an integer value.

Traditionally, when reading the word of instructions from the cache, memory cells associated with each instruction are individually accessed and latched. The word may include multiple instructions, two or more of which may be located along a single word line. The word may also include instructions that are located along different word lines. Multiple read cycles are executed to access each word of instructions.

During each read cycle, the row path and multiple column paths associated with a particular instruction are asserted. Additional tasks include decoding row and column addresses, generating a word line signal, precharging associated bit lines, sensing-amplification and latching of the data. Each word line of the array may include multiple instructions, which may be associated with the same or different words. For example only, four (4) to eight (8) instructions may be associated with one word line.

Referring now to FIG. 1, signal timing of a discrete read access mode for a processor memory is shown. Various signals that are based on a clock signal 10 are generated. The timing diagram illustrates a word line signal 12, first and second bit line signals 14 and 16, a sense-amplification signal 18, column select signals $20_1$-$20_M$ and an instruction output signal 22.

Normally when reading an instruction during a read cycle, the word line signal 12 is asserted as shown by word line pulse $24_1$ (generally referred to as word line pulse 24). N−1 other instructions are read during word line pulses $24_2$-$24_N$, respectively, where N is an integer value. In addition, 2*I bit lines of cells corresponding to the instruction are also precharged, where I is the number of cells in an instruction.

The word line pulse 24 is generated for each read cycle. Each read cycle also includes accessing and latching bit information in cells associated with a particular instruction. The word line signal pulses $24_1$-$24_N$ are generated based on the rising edges $26_1$-$26_N$ of the clock signal 10, as indicated by arrows $27_1$-$27_N$. The word line signal pulse $24_1$-$24_N$ is generated for each of clock pulses $28_1$-$28_N$, respectively.

Activation of a word line causes bit line separation between voltage levels of bit lines. Bit line separation refers to a difference between voltage potentials of the bit lines of the memory cell. For example only, bit line separation is shown by varying gap 30 between the bit line signals 14, 16. Bit line separation may increase with the amount of time that the word line is enabled. Increase in bit line separation is shown by ramp portions $32_1$-$32_N$ of the second bit line signal 16 relative to the first bit line signal 14.

Bit lines associated with the word of instructions are precharged prior to the generation of the word line pulse and during a deactivation state. Bit line separation may return to minimum or no separation during precharging after the word line signal 12 is de-asserted, as illustrated by falling edges $38_1$-$38_N$ of the word line signal 12. A decrease in bit line separation is shown by ramp portions $40_1$-$40_N$ of the second bit line signal 16 relative to the first bit line signal 14.

Bit line separation occurs due to leakage of the memory cell. For example only, leakage can cause voltage potentials of bit lines to decrease or increase relative to each other, which may impact bit line separation. When bit line separation is too small, the ability to accurately read data from a cell decreases. When bit line separation is too large, access time may be decreased and/or the amount of power needed to supply or remove from the bit lines to return the bit lines to a set separation may increase.

The sense-amplification signal 18 is generated to initiate acquiring, amplifying, and latching of bit information stored in a cell array. The sense amplification signal 18 is generated based on the rising edges 26, as denoted by arrows $41_1$-$41_N$. The columns of the cell array that are associated with the instruction are selected. The selection may occur with the generation of the word line pulse. Five column selection signals are shown, which represent the selection of column sets associated with five instructions. The instructions may be associated with one or more words of instructions. The sense-amplification signal 18 is generated to detect bit line separation for the selected cells, which provides bit information.

The sense-amplification signal 18 may be generated with the falling edges of the word line signal 12 and the column selection signals $20_1$-$20_M$, where M is an integer value. The bit information for each cell of the instruction is latched and provided as the instruction output signal 22 based on rising edges $42_1$-$42_N$ of the sense-amplification signal 18, as denoted by arrows $44_1$-$44_N$. Four instructions of the instruction output signal 22 are shown and identified as Instruction[0]-Instruction[3].

When accessing the instruction, certain cells of the selected word line may be retrieved an latched. Other cells may be discarded where discarded refers to the non-selection and non-latching of bits within asserted cells. Since all of the cells along a word line are asserted for one read cycle and only one instruction is latched per word line assertion, bits of other asserted non-selected cells in that word line are discarded.

Power is wasted by asserting the same word line again for another instruction on the same word line.

According to the present disclosure, power consumption is reduced by reducing precharging events and/or assertion of the same word line when accessing instructions associated with the same word line.

Figure 2:
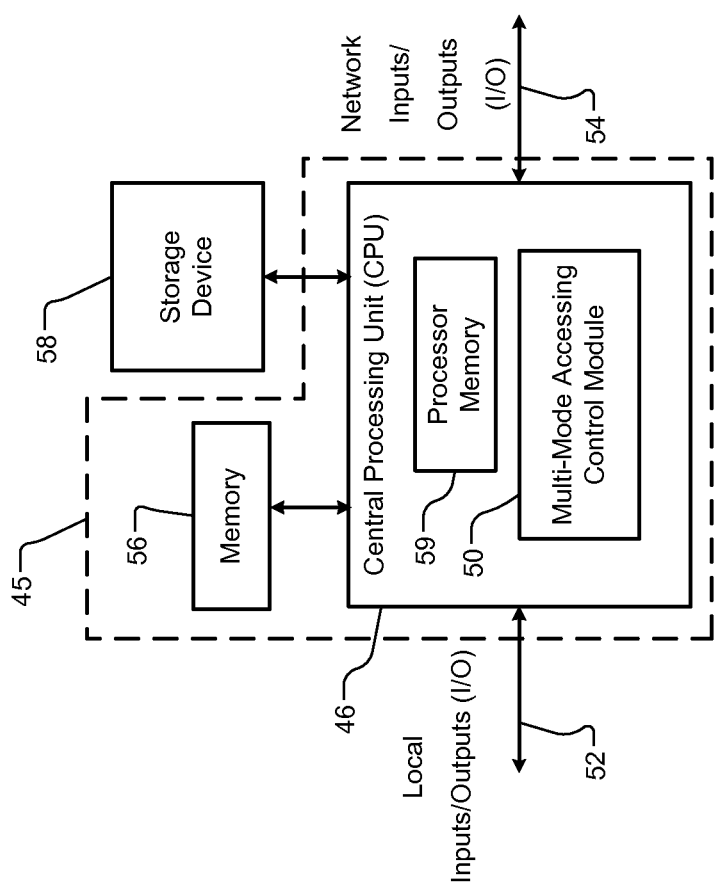
FIG. 2 is a functional block diagram of a central processing unit (CPU) with a multi-mode accessing control module in accordance with the present disclosure.

Referring now to FIG. 2, an integrated circuit (IC) 45 includes a central processing unit (CPU) 46 that includes a multi-mode accessing control module 50. The CPU may include one or more sets of inputs and outputs (I/O) such as those identified at 52 and 54, respectively.

The CPU 46 communicates with a memory 56, which may be implemented as part of the IC 45 or as a separate memory. The CPU 46 includes processor memory 59 that is integrated with the CPU 46. For example, the processor memory 59 may operate as cache for the CPU 46. The memory 59 may include RAM, SRAM or other high speed memory. The control module 50 operates in multiple read modes in association with the processor memory 59. A mass storage device 58 such as a hard disk drive may be provided to store data.

The control module 50 operates in a discrete read mode and a sequential read mode. During the discrete read mode, the control module precharges the bit lines and asserts the word line for each instruction. During the sequential read mode, the control module 50 reduces precharging of the bit lines and/or assertion of the word line when accessing multiple instructions along the same word line. As can be appreciated, the control module operates in discrete and sequential write modes as well using a similar approach.

Power can be saved reducing word line assertion and/or reducing precharging of bit lines. For example only, when two instructions are associated with the same word line, both instructions are accessed using a single word line assertion. For example only, when two or more instructions are associated with the same word line, the bit lines can be precharged once rather than two or more times. One or both of these approaches may be used to reduce power consumption as compared to the discrete read mode.

The memory 56 may include random access memory (RAM) and/or nonvolatile memory such as flash memory, semiconductor memory, solid state memory, phase change memory, or multi-state memory, in which each memory cell has more than two states. The storage device 58 may include an optical storage drive, such as a DVD drive, and/or a hard disk drive (HDD).

Figure 3:
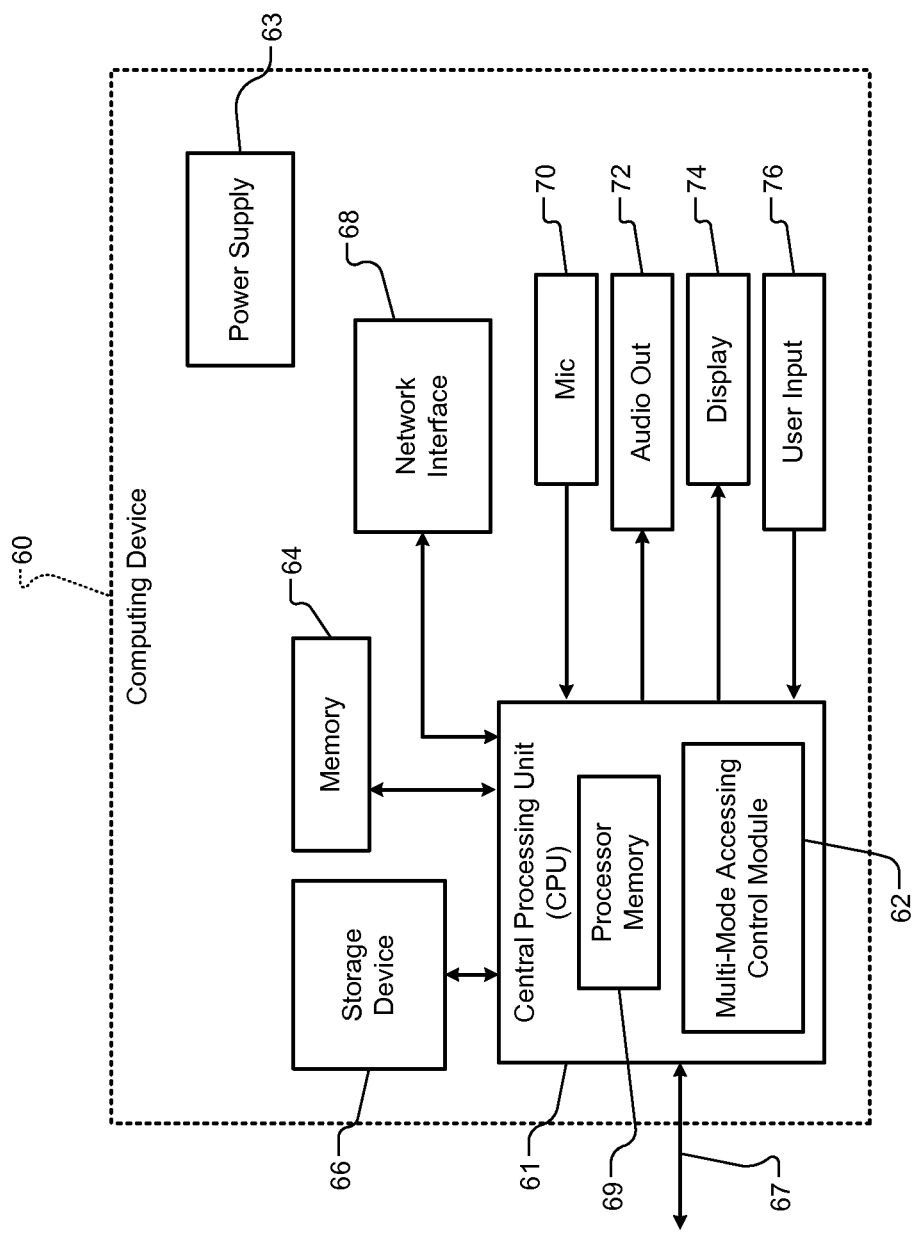
FIG. 3 is a functional block diagram of a computer incorporating a CPU with a multi-mode accessing control module in accordance with the present disclosure.

Referring now to FIG. 3, a functional block diagram of a computing device 60 is shown. The computing device 60 operates in the sequential read mode and the discrete read mode and/or the sequential write mode and the discrete write mode. The computing device 60 may be a cellular phone, network switch, router or interface, a personal computer, such as a desktop or laptop computer, a personal data assistant, an MP3 player, a global positioning system (GPS) device, etc.

The computing device 60 includes a CPU 61 that has a multi-mode accessing control module 62 that controls access to the memory 59. The computing device 60 may also include a power supply 63, memory 64, a storage device 66, and a cellular network interface 67. The CPU 61 also includes processor memory 69. The processor memory 69 may be operated as cache. The CPU 61 may also include a network interface 68, a microphone 70, an audio output 72 such as a speaker and/or output jack, a display 74, and a user input device 76 such as a keypad and/or pointing device. If the network interface 68 includes a wireless local area network interface, an antenna (not shown) may be included.

During the discrete read mode, the control module 62 precharges the bit lines and asserts the word line for each instruction. During the sequential read mode, the control module 50 reduces precharging of the bit lines and/or assertion of the word line when accessing multiple instructions along the same word line. Power can be saved by reducing word line assertion and/or precharging of bit lines.

The processor 61 may receive input signals from other devices such as the cellular network interface 67, the network interface 68, the microphone 70, and/or the user input device 76. The processor 61 may process signals, including encoding, decoding, filtering, and/or formatting, and generate output signals. The output signals may be communicated to one or more of the memory 64, the storage device 66, the cellular network interface 67, the network interface 68, and the audio output 72.

Figure 4:
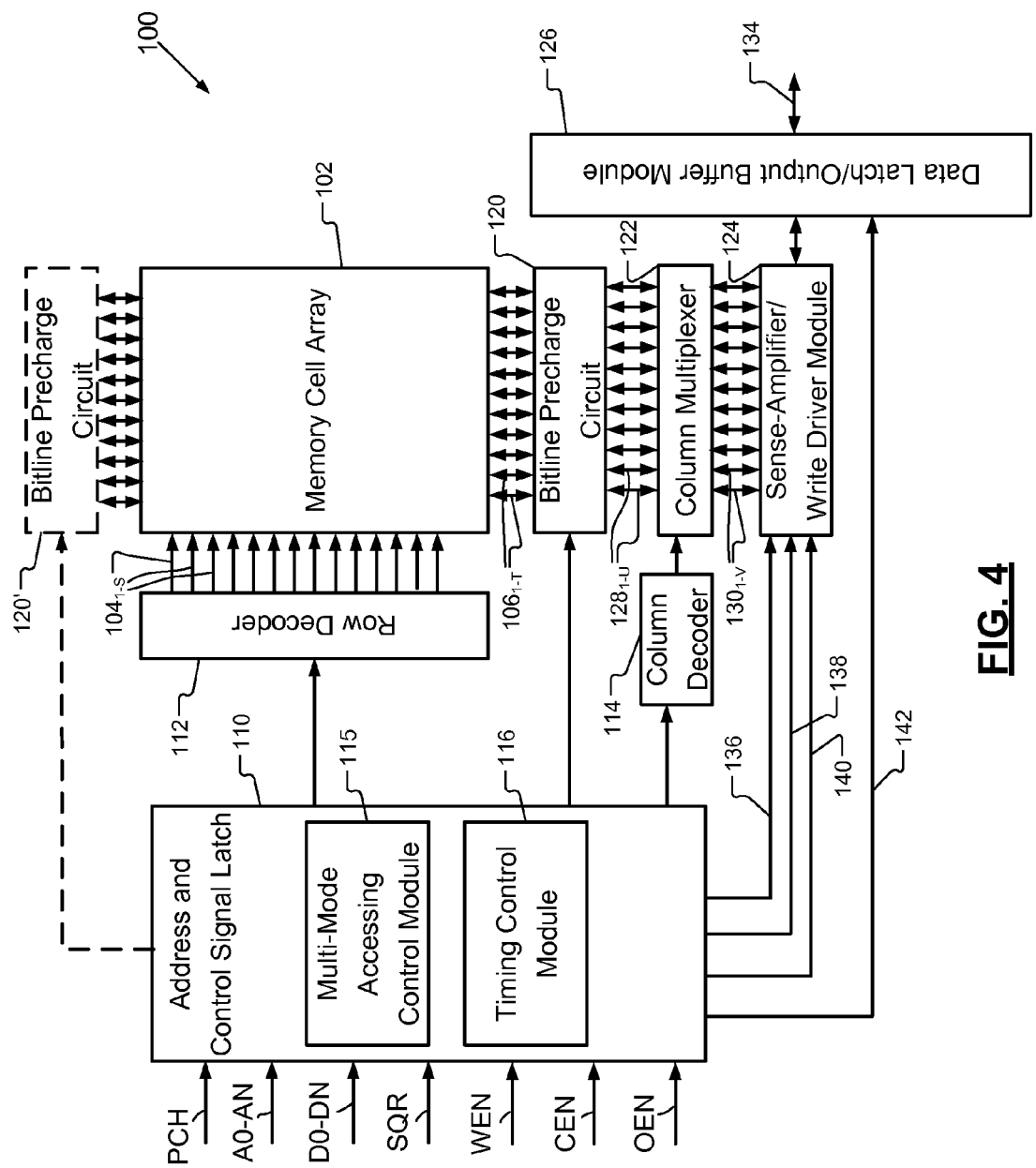
FIG. 4 is a functional block diagram of a multi-mode processor in accordance with the present disclosure.

Referring now to FIG. 4, an exemplary multi-mode processor 100 is shown. The processor 100 may be used in the implementations of FIGS. 2 and 3. The processor 100 includes a memory cell array 102, which includes rows and columns of memory cells. The memory cells are accessed through row and column selection. A row is selected by asserting a word line and a column is selected by asserting or precharging a pair of bit lines. Word line signals are denoted as $104_{1-S}$ and bit line signals are denoted as $106_{1-T}$ where S and T are integer values.

An address and control signal latch 110 receives address information, which is used by a row decoder 112 and a column decoder 114 to select the rows and columns of the memory cell array 102. The address and control signal latch 110, as well as other elements of the processor 100, such as the row decoder 112 and the column decoder 114, may be considered part of a multi-mode control module 115.

The address and control signal latch 110 may include the multi-mode accessing control module 115 and/or a timing control module 116. The address and control signal latch 110 communicates with a bus and receives a signal that has data D0-DN that is stored on the memory cell array 102 during a write mode. The address and control signal latch 110 may also receive a precharge (PCH) signal, a signal-to-quantization ratio (SQR) signal, a write enable signal (WEN), a chip enable signal (CEN), and an output enable signal (OEN) for respective improvement in SQR, enablement of the write mode, operation of the memory cell array, and generation of an output signal.

The SQR signal may indicate whether the processor 100 is operating in a sequential read mode or in a discrete read mode. The PCH signal may indicate when the processor is performing a precharge of bit lines.

The processor 100 further includes a bit line precharge circuit 120, a column multiplexer 122, a sense-amplifier/write driver module 124, and a data latch/output buffer module 126. The bit line precharge circuit 120 is used to precharge the bit lines of the memory cell array 102. The bit line precharge circuit 120 may include drivers, buffers, transistors and/or other bit line asserting elements. The bit line precharge circuit 120 may be coupled between the memory cell array 102 and the column multiplexer 122 or may be located on an opposite side of the memory cell array 102 as the column multiplexer 122, as shown by dashed bit line precharge circuit 120'. The bit line precharge circuit may precharge all of the bit lines $106_{1-T}$ during each precharge event.

During a read mode, the column multiplexer 122 is used to select the columns of the memory cell array 102 for latch purposes via column selection signals $128_{1-U}$, where U is an integer value. After precharging of the bit lines, the column decoder 114, via the column multiplexer 122, selects certain columns. Stored bits, associated with the selected columns, are provided to one or more sense amplifiers of the sense-amplifier/write driver module 124 for amplification prior to reception by the data latch/output buffer module 126. The stored bits are received as bit information signals $130_{1-V}$, where V is an integer value.

The sense-amplifier/write driver module 124 receives a read/write mode signal 136, a sense-amplifier (SA) precharge signal 138, and a SA enable signal 140. The read/write mode signal 136 is a command signal for read or write operation. The SA precharge signal 138 and the SA enable signal 140 are generated to initiate and activate SA cells of the sense-amplifier/write driver module 124. The amplified data is latched and provided in the form of an output signal 134 by the data latch/output buffers module 126 based on a latch signal 142 from the address and control signal latch 110.

During the write mode, cells in the memory cell array 102 are similarly asserted via the row decoder 112 and the column decoder 114. The received data D0-DN is provided to the bit lines via write drivers in the sense-amplifier/write driver module 124.

Figure 5:
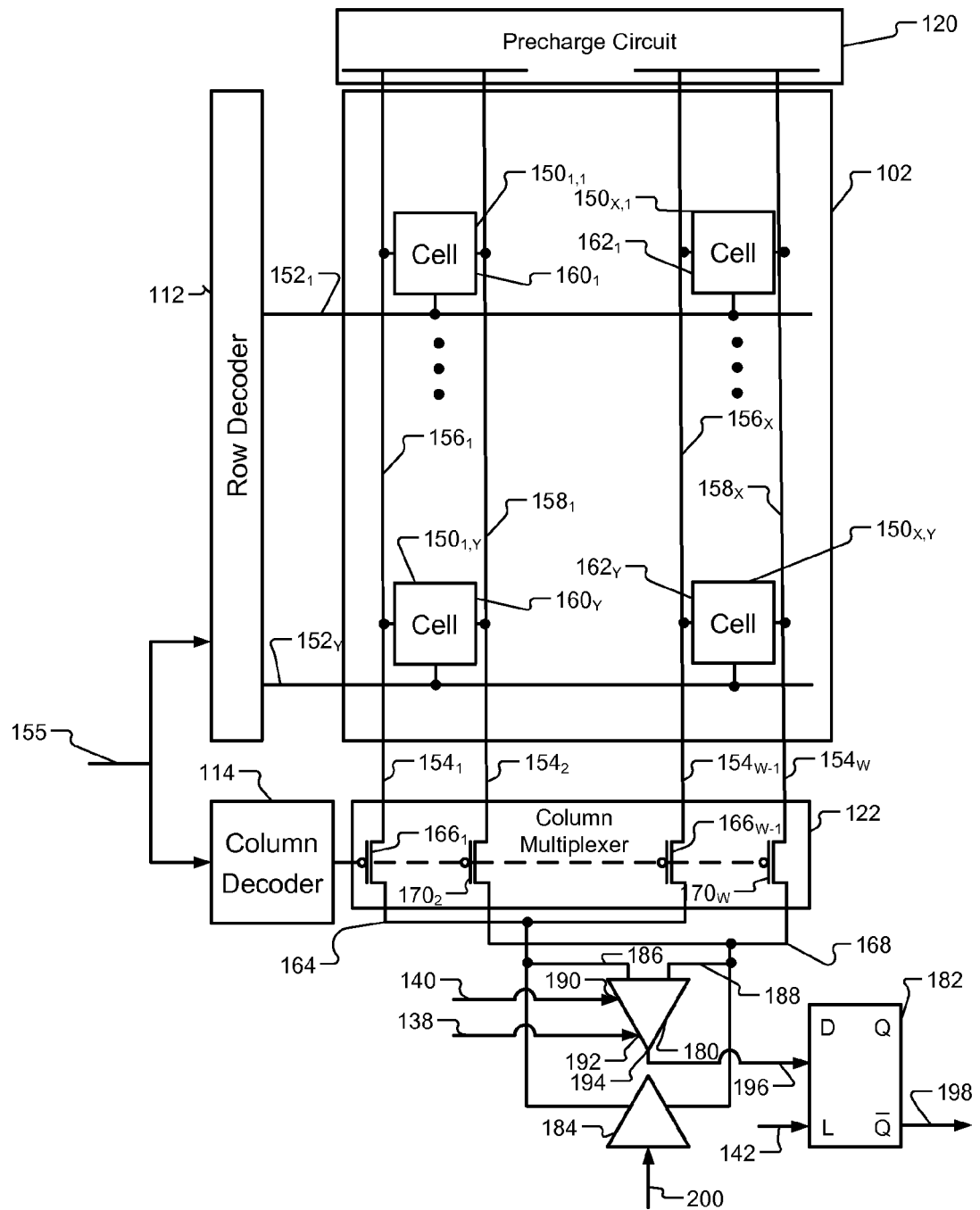
FIG. 5 is a block and schematic diagram of a portion of the processor of FIG. 4.

Referring also to FIG. 5, a portion of the processor 100 is shown. The memory cell array 102 includes cells $150_{1-X, 1-Y}$, which each store a bit of information. The cells $150_{1-X, 1-Y}$ are asserted via word lines $152_{1-Y}$ by the row decoder 112 and via bit lines $154_{1-W}$ by the column decoder 114 and the bit line precharge circuit 120, where X, Y and W are integer values. Row decoding and column decoding is based on an address input signal 155. Each of the cells $150_{1-X, 1-Y}$ has an associated first bit line and a second bit line, such as first bit lines $156_{1-X}$ and second bit lines $158_{1-X}$ for cells $160_{1-Y}$, $162_{1-Y}$, respectively.

The first bit lines 156 are coupled together by a first common line 164 through respective transistors $166_{1-W}$ of the column multiplexer 122. The second bit lines $158_{1-X}$ are coupled together at a second common line 168 through respective transistors $170_{1-W}$ of the column multiplexer 122. The column decoder 114 selects the cells $150_{1-X, 1-Y}$ via the column multiplexer 122. The column multiplexer 122 may include transistors, as shown, or other bit line selection devices. The transistors may include p-channel metal-oxide-semiconductor field-effect (PMOS) transistors, as shown, or other transistors.

For the example implementation shown, a sense-amplifier (SA) 180, a latch (shown as a D-flip flop) 182, and a write driver 184 are included. The SA 180 is coupled to the column multiplexer 122. The SA 180 and the write driver 184 are part of the sense-amplifier/write driver module 124. The SA 180 includes first and second inputs lines 186, 188, a SA enable input 190, a SA precharge input 192 and a SA output 194. The first input line 186 is coupled to the first common line 164 and the second input line 188 is coupled to the second common line 168. The first common line 164 and the second common line 168 have SA bit A and SA bit B signals, respectively. The SA enable input 190 and the SA precharge input 192 receive the SA enable signal 140 and the SA precharge signal 138, which may be generated by the control module 115 and/or the address and control signal latch 110.

Information on selected bit lines is provided via the column multiplexer 122 and detected and amplified by the SA 180. An SA output signal 196 from the SA output 194 is provided to the latch 182 at terminal D. Data at terminal D is latched and provided to data output terminal $\overline{Q}$ of the latch 182 and outputted as a data output signal 198. The data is latched based on the received latch signal 142. The received latch signal 142 may be generated by the control module 115 and/or the address and control signal latch 110. The SA 180 receives the SA precharge signal 138 and asserts the SA input lines 186, 188 (best seen in FIG. 6).

The latch 182 and the write driver 184 are respectively used for output and writing purposes. The latch 182 may be a D-flip flop as shown or some other latching device. The latch 182 acquires data on the SA output 194 and may be part of the data latch/output buffer module 126. The write driver 184 receives a data input signal 200 and provides data, which may be amplified, on the common lines 164, 168. From the common lines 164, 168 the data may be provided to the appropriate column of bit lines.

Figure 6:
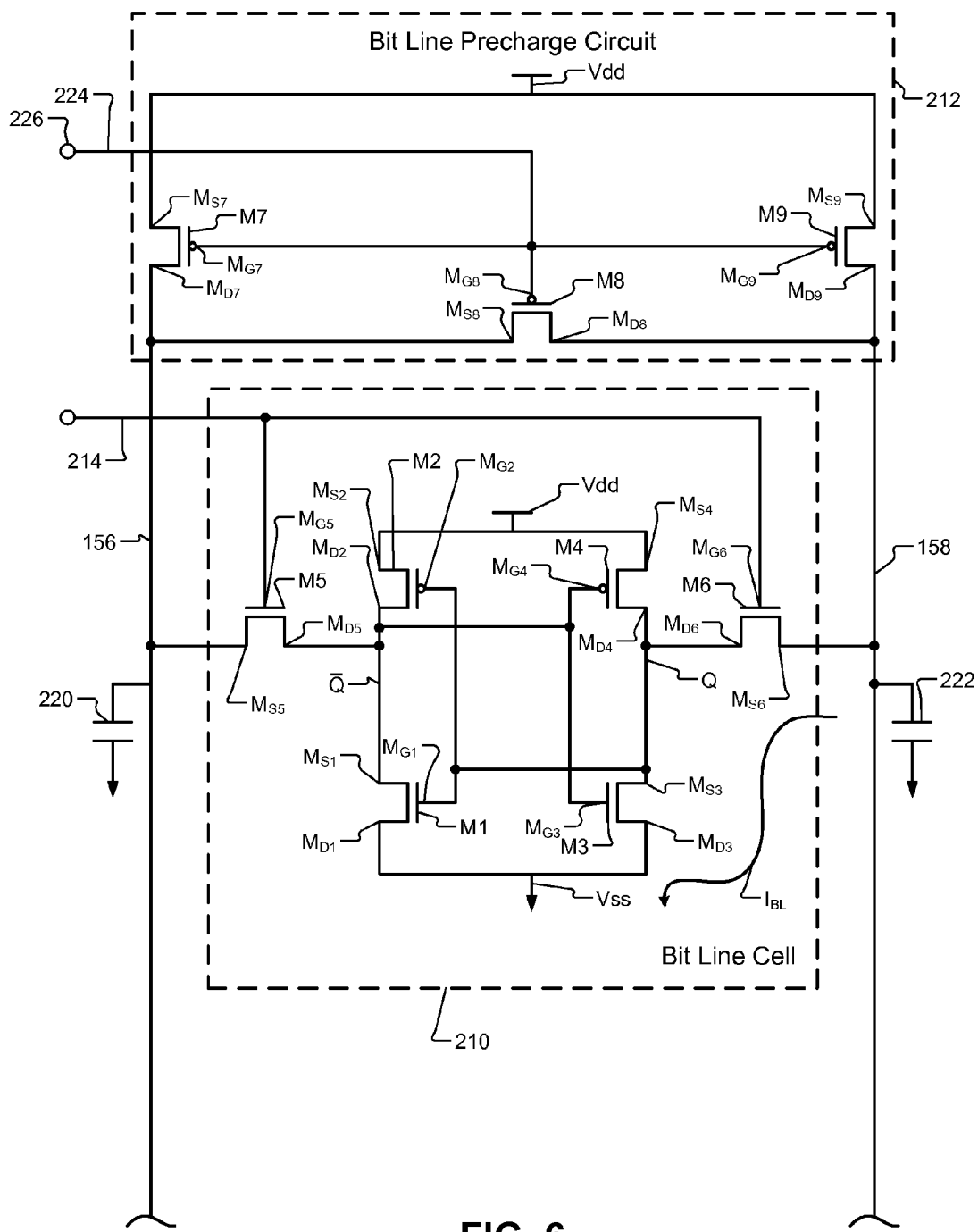
FIG. 6 is an exemplary storage cell and corresponding bit line precharge circuit in accordance with the present disclosure.

Referring to FIG. 6, an exemplary storage cell 210 and a corresponding bit line precharge circuit 212 is shown. The cell 210 is provided to illustrate one example configuration of a cell, which may be incorporated in the memory cell array 102 described above. Other configurations may be used.

The cell 210, as shown, includes four storage transistors M1-M4 and two access transistors M5, M6. The four storage transistors M1-M4 form two-cross-coupled inverters that store a bit of information. The access transistors M5, M6 control access to the four storage transistors M1-M4, during read and write operations. The four storage transistors M1-M4 serve as a storage cell. The precharge circuit 212 includes transistors M7, M8, M9. The transistors M1-M9 may be PMOS or n-channel MOSFET (NMOS) transistors, as shown, or other transistors. In the implementation shown, the transistors M2, M4, and M7-M9 are PMOS transistors and the transistors M1, M3, M5, M6 are NMOS transistors. The transistors M1-M9 have respective source terminals $M_{S1}$-$M_{S9}$, drain terminals $M_{D1}$-$M_{D9}$, and gate terminals $M_{G1}$-$M_{G9}$.

The cell 210 has a word line 214 and may have the first and second bit lines 156, 158. The first and second transistors M1, M2 are coupled in series and in parallel to the third and fourth transistors M3, M4, which are also coupled in series. The source terminals $M_{S2}$, $M_{S4}$ are coupled to a positive power source terminal Vdd. The drain terminals $M_{D2}$, $M_{D4}$ are coupled to source terminals $M_{S1}$, $M_{S3}$. The gate terminals $M_{G1}$, $M_{G2}$ are coupled together and to source terminal $M_{S3}$. The gate terminals $M_{G3}$, $M_{G4}$ are coupled together and to the drain terminal $M_{D2}$. The drain terminals $M_{D1}$, $M_{D3}$ are coupled to a negative power source terminal Vss. The source terminal $M_{S5}$ is coupled to the drain terminal $M_{D2}$. The source terminal $M_{S6}$ is coupled to the drain terminal $M_{D4}$. The source terminal $M_{S5}$ and the drain terminal $M_{D7}$ are coupled together and to the first bit line 156. The source terminal $M_{S6}$ and the drain terminal $M_{D9}$ are coupled together and to the second bit line 158.

Capacitance devices 220, 222, are shown and represent respective capacitance of bit line storage circuits associated with the bit lines 156, 158. The capacitance devices 220, 222 may be discrete storage capacitors, as shown, or may represent capacitance measured at each of the bit lines 156, 158 relative to reference potentials.

The bit line precharge circuit 212 receives a bit line precharge signal 224 via the bit line precharge input 226, which is provided to the gates $M_{G7}$-$M_{G9}$. The sources $M_{S7}$, $M_{S9}$ are coupled to the power source terminal Vdd. The drain $M_{D7}$ is coupled to the source $M_{S8}$ and the drain $M_{D9}$ is coupled to the drain $M_{D8}$.

Access to the cell 210 is enabled by assertion of the word line 214, which controls the access transistors M5, M6. In general, voltage potential of the second bit line 158 may be an inverse of the voltage potential of the first bit line 156. The cell 210 has three modes of operation, standby, read and write. Bit values, such as a zero (0) and a one (1) that are stored at locations denoted Q and $\overline{Q}$. During standby mode the word line 214 is not asserted and the transistors M1-M4 reinforce each other.

During the read mode, a read cycle is started by precharging both of the bit lines 156, 158. The word line 214 is then asserted, thereby enabling the transistors M5, M6. The stored values Q and $\overline{Q}$ are transferred to the bit lines 156, 158 by maintaining charge on one of the bit lines and discharging the other bit line. The bit line for which charge is maintained is pulled to Vdd. The bit line that is discharged is pulled to ground.

During the write mode, a value to be written is applied to the bit lines 156, 158. The word line 214 is then asserted and the value to be stored is latched into the cell 210. Write drivers override the previous state of the cross-coupled inverters.

Figure 7:
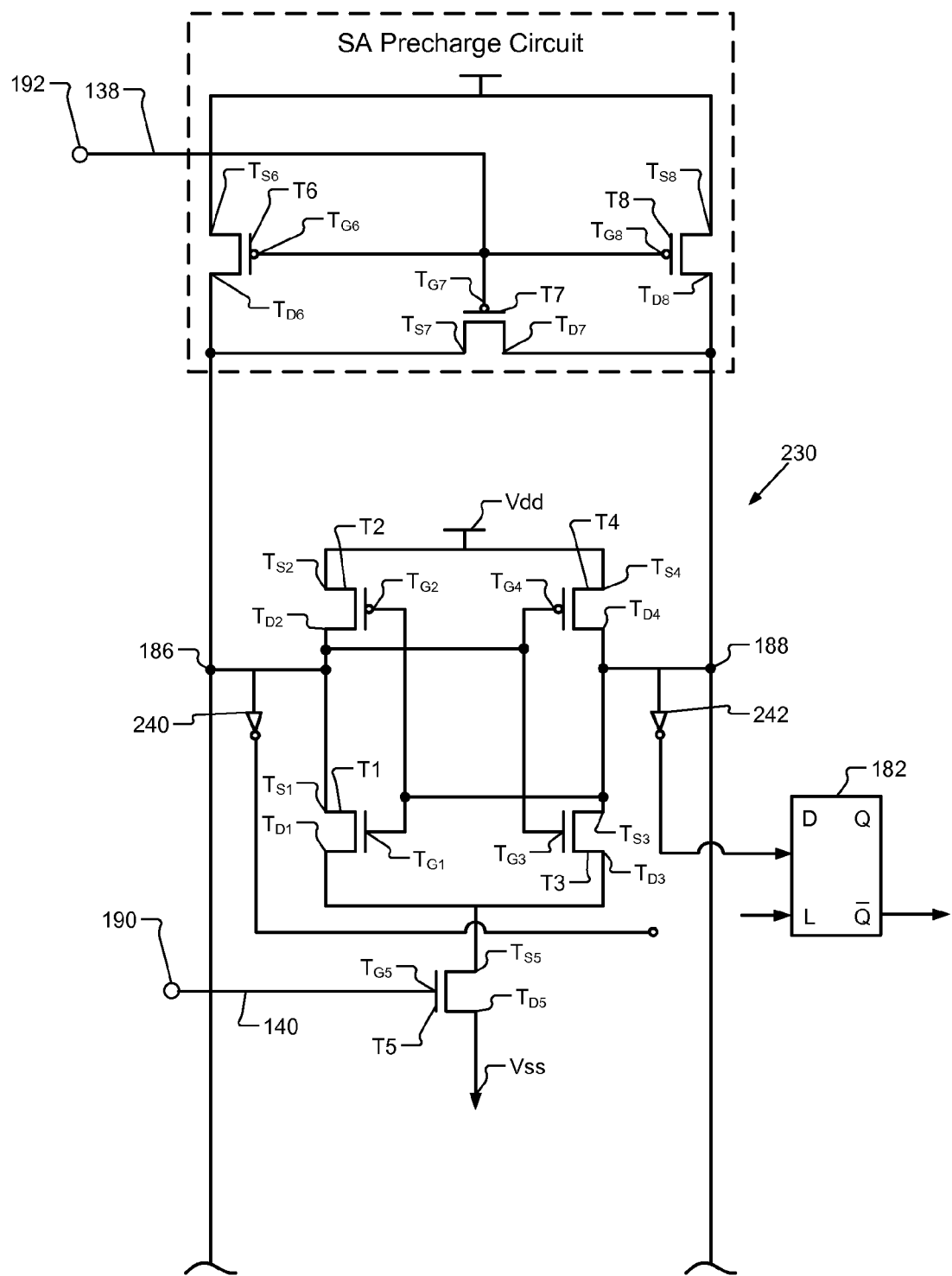
FIG. 7 is a schematic diagram of a sense-amplifier circuit and corresponding sense-amplifier precharge circuit in accordance with the present disclosure

Referring to FIG. 7, a schematic diagram of a SA circuit 230 including a SA precharge circuit 232 is shown. The SA circuit 230 and the SA precharge circuit 232 may be used as part of or in replacement of the SA 180. The SA circuit 230 includes five transistors T1-T4, which form an SA cell 234 and are cross-coupled, and a fifth transistor T5. The SA precharge circuit 232 includes three transistors T6-T8. The transistors T1-T8 may be PMOS or n-channel MOSFET (NMOS) transistors, as shown, or other transistors. In the implementation shown, the transistors T2, T4, and T6-T8 are PMOS transistors and the transistors T1, T3, T5 are NMOS transistors. Each of the transistors T1-T8 has respective source terminals $T_{S1}$-$T_{S8}$, drain terminals $T_{D1}$-$T_{D8}$, and gate terminals $T_{G1}$-$T_{G8}$.

The first and second transistors T1, T2 are coupled in series and in parallel to the third and fourth transistors T3, T4, which are also coupled in series. The source terminals $T_{S2}$, $T_{S4}$ are coupled to a positive power source terminal Vdd. The drain terminals $T_{D2}$, $T_{D4}$ are coupled to the source terminals $T_{S1}$, $T_{S3}$. The gate terminals $T_{G1}$, $T_{G2}$ are coupled together and to the source terminal $T_{S3}$. The gate terminals $T_{G3}$, $T_{G4}$ are coupled together and to the drain terminal $T_{D2}$. The drain terminals $T_{D2}$, $T_{D4}$ may be respectively coupled to the common lines 186, 188, which may be referred to as SA common lines. The drain terminals $T_{D1}$, $T_{D3}$ are coupled to the source terminal $T_{S5}$. The gate terminal $T_{G5}$ may be coupled to the SA enable input 190. The drain terminal $T_{D5}$ is coupled to a negative power source terminal Vss. The drain terminals $T_{D2}$, $T_{D6}$ are coupled together. The drain terminals $T_{D4}$, $T_{D8}$ are coupled together.

The SA precharge circuit 232 receives the SA precharge signal 138 via the SA precharge input 192, which is provided to the gate terminals $T_{G6}$-$T_{G8}$. The source terminals $T_{S6}$, $T_{S8}$ are coupled to the power source terminal Vdd. The drain terminal $T_{D6}$ is coupled to the source terminal $T_{S7}$ and the drain terminal $T_{D8}$ is coupled to the drain terminal $T_{D7}$.

Inverters 240, 242 are coupled to the common lines 186, 188. One of the common lines 186, 188 is provided to the data input D of the latch 182. Although the second common line 188 is shown as being coupled to the data input D, the first common line 186 may be coupled to the data input D.

Figure 8:
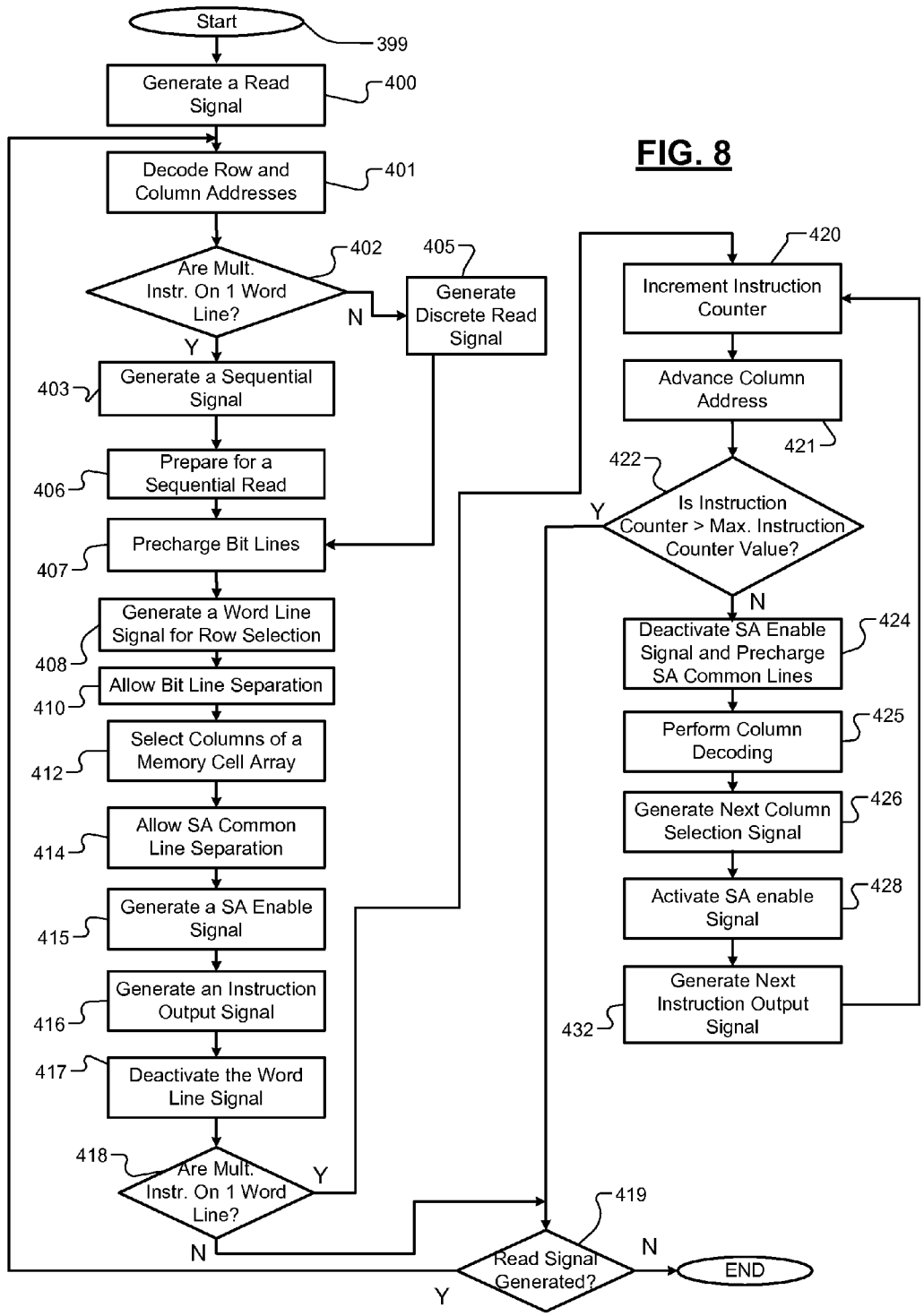
FIG. 8 is a logic flow diagram illustrating a method of operating a multi-mode processor in accordance with the present disclosure.
Figure 9:
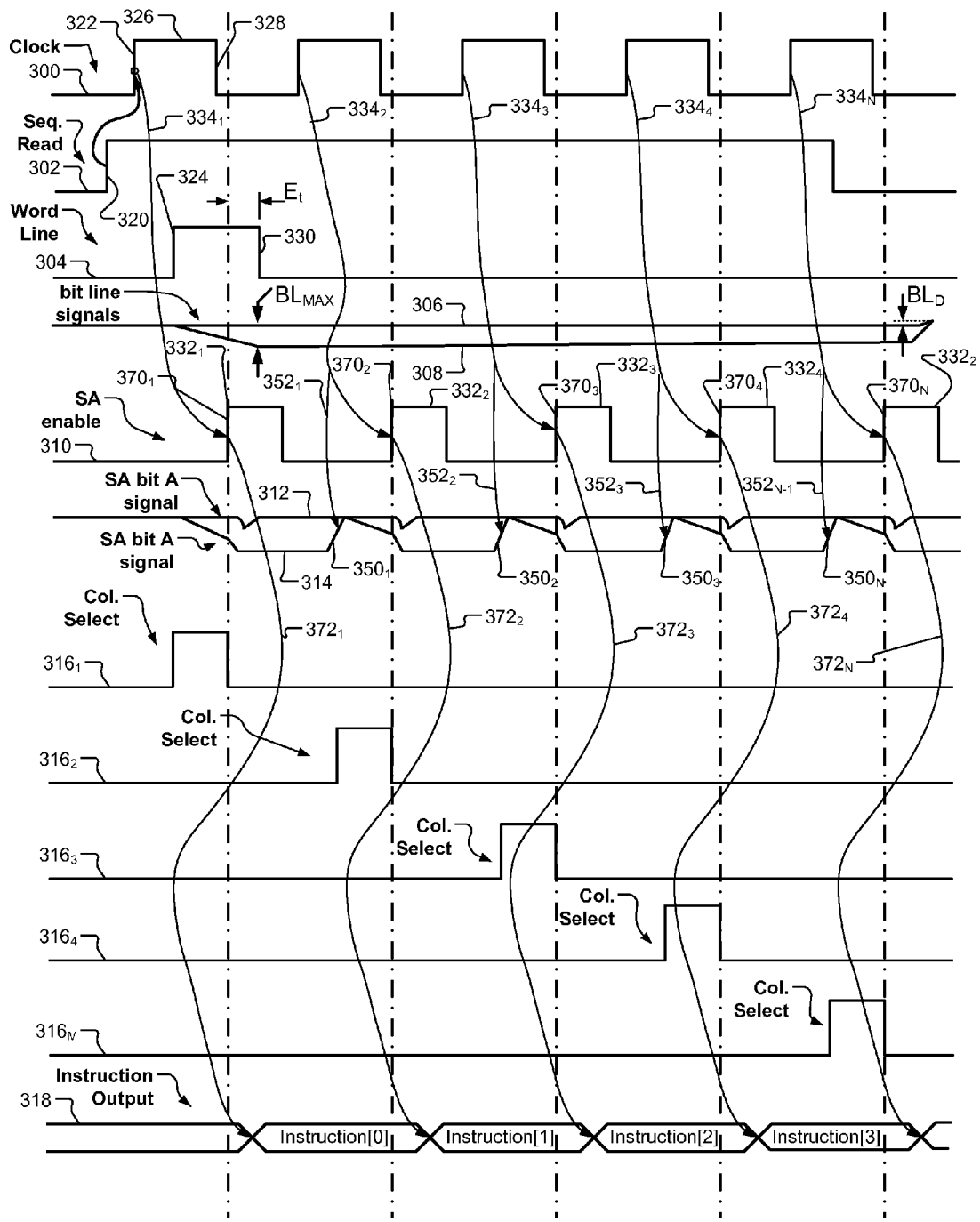
FIG. 9 is a signal timing diagram illustrating operation of the multi-mode processor during a sequential read mode of FIG. 8 in accordance with the present disclosure.

Referring to FIGS. 8 and 9, flow and timing diagrams are shown. The timing diagram includes multiple signals that are based on a clock signal 300 and a sequential read signal 302. The sequential read signal 302 is indicative of a sequential read mode. For the example shown, when the sequential read signal 302 is HIGH, a processor is operated in a sequential read mode; otherwise the processor is operated in a discrete read mode. The timing diagram includes a word line signal 304, bit line signals (voltage levels) 306, 308, a SA enable signal 310, a SA bit A signal 312, a SA bit B signal 314, column select signals 316$_{1-M}$ and an instruction output signals 318. Although several of the steps of the flow diagram are described below with respect to the timing diagram, the flow diagram may be modified to apply to other timing diagrams and/or implementations of the present disclosure.

The flow diagram may begin at step 399. In step 400, a read signal is generated to read a word of instructions from a processor memory, such as the processor memories 59, 69. In step 401, received addresses for the word of instructions are row and column decoded, such as by the row and column decoders 112, 114.

In step 402, the processor determines whether two or more of the instructions are located along a single word line. When two or more instructions are located along a single word line, the processor proceeds to step 403. When the processor is reading a single instruction along a word line, the processor proceeds to step 405. Steps 400-432 or any portion thereof may be repeated when reading instructions from multiple word lines.

In step 403, the processor generates the sequential read signal 302, illustrated by rising edge 320. In step 406, the processor prepares for a sequential read. Between the rising edge 320 and a rising edge 322 of the clock signal 300, the processor may perform tasks to prepare for the sequential read. The tasks may include initializing an instruction counter, setting parameters for generation of an extended word line signal, generating SA precharge signals for read cycles, precharging of bit lines, precharging of common lines, etc. The extended word line signal refers to a word line pulse that is increased in duration to increase bit line separation.

In step 405, the processor generates a discrete read signal. After performance of step 405 or 406, step 407 is performed.

In step 407, bit lines for cells along a word line and associated with the word of instructions are precharged. Steps 406 and/or 407 may be repeated when control does not have knowledge of a previous precharge of bit lines and/or timing of a precharge of bit lines is undetermined or improper. Control may not have knowledge of a previous precharge when control cannot determine the current precharged state of the bit lines or the state of a current read sequence. The state of the read sequence may include the state of a word line, such as when a word line has been asserted.

The timing of a precharge of bit lines may be improper when the amount of time between precharge events exceeds a predetermined period. When the amount of time since the last precharge event exceeds the predetermined period, an accurate read may not be able to be performed due to an improper amount of bit line separation. Thus, a precharge may be performed before the predetermined period is exceeded. Steps 406 and 407 may not be repeated when control does have knowledge of a previous precharge of bit lines and/or timing of a precharge is known and/or proper.

Control may perform a precharge, which may be in addition to a previous precharge, based on knowledge, timing, and state of a current precharge. A precharge instruction may be generated at any point in the sequential read mode to perform a precharge. Thus, steps 406 and 407 may be repeated independently of prior precharging. For example, step 407 may be repeated and performed during or after step 424. In other words, another precharge event of the bit lines may be performed between steps 424 and 432, although instructions along a current word line have not all been received and/or executed. A precharge command signal may be generated to perform a precharge.

Control parameters may be updated to account for the precharge performed based on the precharge command signal. When a precharge command signal is generated, control may continue to perform in the current operating mode, such as a sequential read mode or a discrete read mode, or may change operating modes. For example, when operating in a sequential read mode and upon generation of a precharge command signal, control may perform a precharge and continue operating in the sequential read mode or begin operating in a discrete read mode.

In step 408, the processor generates the word line signal 304, illustrated by rising edge 324 of the word line signal 304, in the middle of a clock pulse 326 based on the row decoded addresses. The word line signal 304 is in the form of a pulse, which is generated for a first instruction, Instruction [0]. The word line signal 304 may not be generated for subsequent instructions, which are accessed along the same or a single word line. The word line signal 304 remains in an active or HIGH state until after detection of a falling edge 328 of the clock signal 300 and until approximately the middle of a subsequent LOW clock signal state. This provides an extended active word cycle, which increases bit line separation. An extended period of the word line signal 304 is denoted as $E_t$.

In order to accurately read bits from a cell array, a minimum bit line separation is provided. This bit line separation may be provided by a multi-mode accessing control module or by a timing control module. The minimum separation may be approximately equal to or greater than 100 mV. In one implementation, the extended active word cycle is set to allow for a bit line separation of approximately equal to the minimum separation plus at least 30 mV, as denoted by maximum bit line separation $BL_{max}$. In another implementation, the extended word cycle is set to allow for bit line separation of approximately 150 mV. The extended word cycle is directly related to number of read cycles for a given word of instructions or number of instructions read for the generated word line signal 304. The additional separation increases the likelihood of an accurate read for each read cycle.

When performing multiple read access cycles, such as in a sequential read mode, control accounts for the amount of leakage that may occur during the read access cycles. The magnitude and polarity of precharging, the number of access cycles, and the timing of the precharging and access cycles are selected and performed to maintain a minimum precharge separation and to assure that a maximum precharge separation is not exceeded.

A bit line separation range may be stored and used to assure that the bit line separation remains within a maximum and minimum separation. Control may have predetermined precharge information relating to an amount of separation that occurs over one or more read cycles. Control may operate in the sequential read mode or perform multiple access cycles for a single precharge based on a clock frequency. For example, control may operate in a discrete mode at high frequencies and in a sequential read mode for low frequencies.

In step 410, with the generation of the word line signal 304, bit line separation begins and thus, voltage potential across bit line pairs increases. The maximum bit line separation $BL_{max}$ occurs approximately with a falling edge 330 of the word line signal 304. The generation of the word line signal causes bit line separation between voltage levels of bit lines.

In step 412, a column selection signal, such as one of the column selection signals 316, is generated to select one or more columns or pair of bit lines associated with an instruction. The column selection signal is generated based on the column decoded addresses. The column selection signal may be provided to a column multiplexer, such as the column multiplexer 122, for selection of the appropriate bit lines. The selection may occur with and/or during the same time period as the generation of the word line signal. In step 414, with the generation of the column selection signal, voltage potential of the common lines begins to separate.

In step 415, the SA enable signal 310 is generated. SA pulses $332_{1-N}$ are generated based on rising edges of the clock signal 300, as denoted by arrows $334_{1-N}$. The SA enable signal 310 activates a SA cell. For example, the SA enable signal 310 may activate the fifth transistor $S_{T5}$, which enables current flow through the SA cell and detection and amplification of SA bit A and/or SA bit B signals 312, 314. The SA bit A and/or SA bit B values are detected and amplified for each of the selected cells. For each cell, a first common line is pulled to voltage potential Vdd and a second common line is pulled to ground.

In step 416, the instruction output signal 318 is generated, which includes data from each of the selected cells for the current instruction. Each instruction portion of the instruction output signal 318 is generated based on the rising edges $370_{1-N}$ of the SA enable signal 310, as denoted by arrows $372_{1-N}$. Either a SA bit A or a SA bit B value is provided to a latch for each of the selected cells. The SA bit A or SA bit B signals 312, 314 may be inverted prior to being received by the latch. A latch signal may be generated to latch the SA bit A or SA bit B values to generate the instruction output signal.

In step 417, the word line signal 304 is deactivated or transitioned from a HIGH state to a LOW state. The deactivation of the word line signal 304 causes the potential of the bit lines to drift as a result of leakage. Over time and read cycles the potential across the bit lines decreases. In the example shown, a voltage potential of a first bit line decreases by approximately 2 mV over a 40 ns period and relative to a first original state of the first bit line, as denoted by bit line drift $BL_D$. The voltage potential of a second bit line increased toward the first bit line. The extended active word cycle assures that there is enough bit line separation during a last read cycle along a word line.

In step 418, when multiple instructions are being read along a single word line, control proceeds to step 420, otherwise control proceeds to step 419. In step 419, when another read signal is generated, control returns to step 401, otherwise control may end.

In step 420, the instruction counter is incremented by one (1). In step 421, the column address may be advanced. The column address may be advanced linearly, successively, or in an interleaved fashion. In step 422, control determines whether the instruction counter is greater than a maximum instruction counter value. The maximum instruction counter value may be a predetermined and/or stored value. When the instruction counter is not greater than the maximum instruction counter value then step 424 is performed, otherwise control proceeds to step 419. In step 419, when another read signal is generated, control returns to step 401, otherwise control may end.

In step 424, upon detection of a rising edge of the next clock cycle, the SA enable signal 310 is transitioned from a HIGH state to a LOW state and a SA precharge signal is generated to precharge the SA common lines. The precharge for each cycle is shown by the rising edges $350_{1-N}$ of the SA bit B signal 314 of one of the SA common lines. The rising edges $350_{1-N}$ are based on the rising edges of the clock signal 300, as denoted by arrows $352_{1-N-1}$. This illustrates potential between the SA common lines decreasing. Note that the energy used to precharge the SA common lines is less than the energy used to precharge the bit lines. For example, the energy to precharge the SA common lines may be approximately 10% of the energy for precharging the bit lines. Thus, energy is saved in performing a SA precharge for each read cycle, as opposed to performing a bit line precharge for each read cycle.

In step 425, column decoding is performed to determine bit lines associated with a next instruction. In step 426, a next column selection signal is generated, such as one of the column selection signals 316, and voltage potential of the SA common lines begin to separate.

In step 428, the SA enable signal 310 is activated. The SA enable signal activates a SA cell. For example, the SA enable signal may activate the fifth transistor $S_{T5}$, which enables current flow through the SA cell and detection and amplification of SA bit A and SA bit B signals 312, 314 for each of the selected cells.

In step 432, the next instruction output signal is generated. Either a SA bit A or a SA bit B value is provided to a latch for each of the selected cells. The SA bit A or SA bit B signals 312, 314 may be inverted prior to being received by the latch. A latch signal may be generated to latch the SA bit A or SA bit B values to generate the instruction output signal.

As an alternative, a SA enable signal and a latch signal may be generated to acquire, amplify, and latch bit information associated with the selected instruction for a current read cycle. The sense-amplification signal may be generated to detect bit line separation for the selected cells, which provides bit information. The sense-amplification signal may be generated with the falling edges of the word line signal and the column selection signal. The bit information for each cell may be latched and provided as an output signal, denoted as instructions in the output signal. Upon completion of step 432, the processor may return to step 420 and repeat steps 420-432 for a next instruction.

The above-described steps are meant to be illustrative examples; the steps may be performed sequentially, synchronously, simultaneously, or in a different order depending upon the application.

Figure 10:
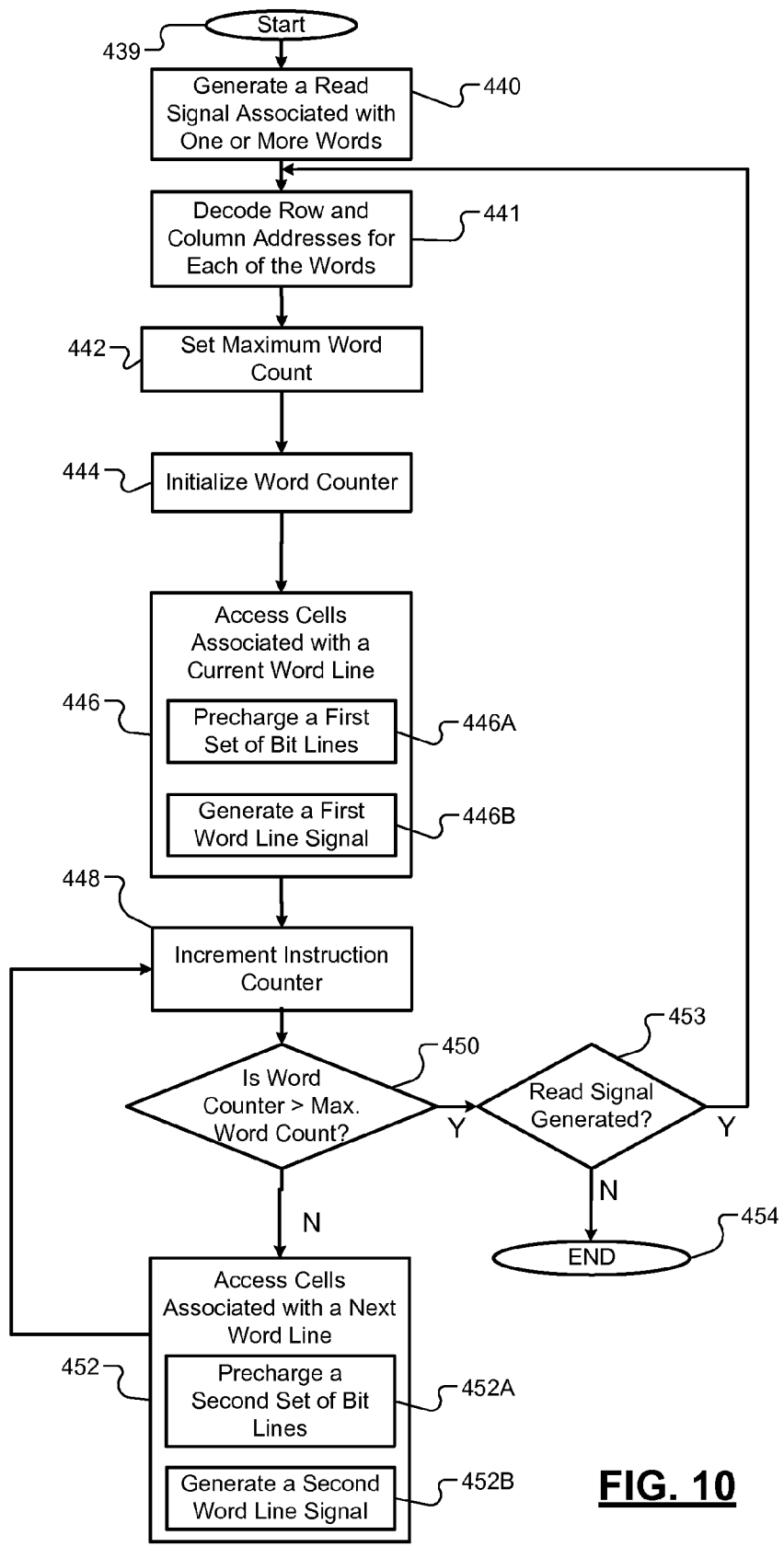
FIG. 10 is a logic flow diagram illustrating a method of operating a multi-mode processor in accordance with the present disclosure.

Referring now to FIG. 10, another method of operating a multi-mode processor is shown. The method may begin at step 439. In step 440, a read signal is generated to read one or more word(s) of instructions from a processor memory, such as the processor memories 59, 69. In step 441, a maximum word count is set equal to the number of words to access. In step 442, a word counter is initialized. The word counter is set equal to the value one (1). In step 444, received addresses for the word(s) of instructions are row and column decoded, such as by the row and column decoders 112, 114. The received addresses may be received during separate time intervals and decoded as received.

Control may access cells associated with each word, as addresses for that word are received. For example, control may access cells associated with a first word before accessing cells associated with a second word. The cells associated with a word may be associated with one or more word lines. The word lines associated with each word may be accessed in any order. When accessing each word line steps 402-432 of the method of FIG. 8 may be performed.

In step 446, cells associated with a first or current word line are accessed. During step 446 control may perform steps 402-432. In step 446A, which may correspond with step 407, a first set of bit lines associated with the current word line is precharged. In step 446B, which may correspond with step 408, the current word line is accessed via generation of a first word line signal. After generation of the appropriate instruction output signal(s) associated with the current word line control proceeds to step 448.

In step 448, the word counter is incremented. In step 450, when the word counter is greater than the maximum word count, control proceeds to step 452, otherwise control proceeds to step 453. In step 453, when another read signal is generated control may return to step 441, otherwise control may end, identified by step 454.

In step 452, cells associated with a second or next word line are accessed. During step 452 control may perform steps 402-432. In step 452A, which may correspond with step 407, a second or next set of bit lines associated with the next word line is precharged. The next set of bit lines may be included in the previous set of bit lines. In step 452B, which may correspond with step 408, the next word line is accessed via generation of a second or next word line signal. After generation of the appropriate instruction output signal(s) associate with the next word line control returns to step 448.

Figure 11:
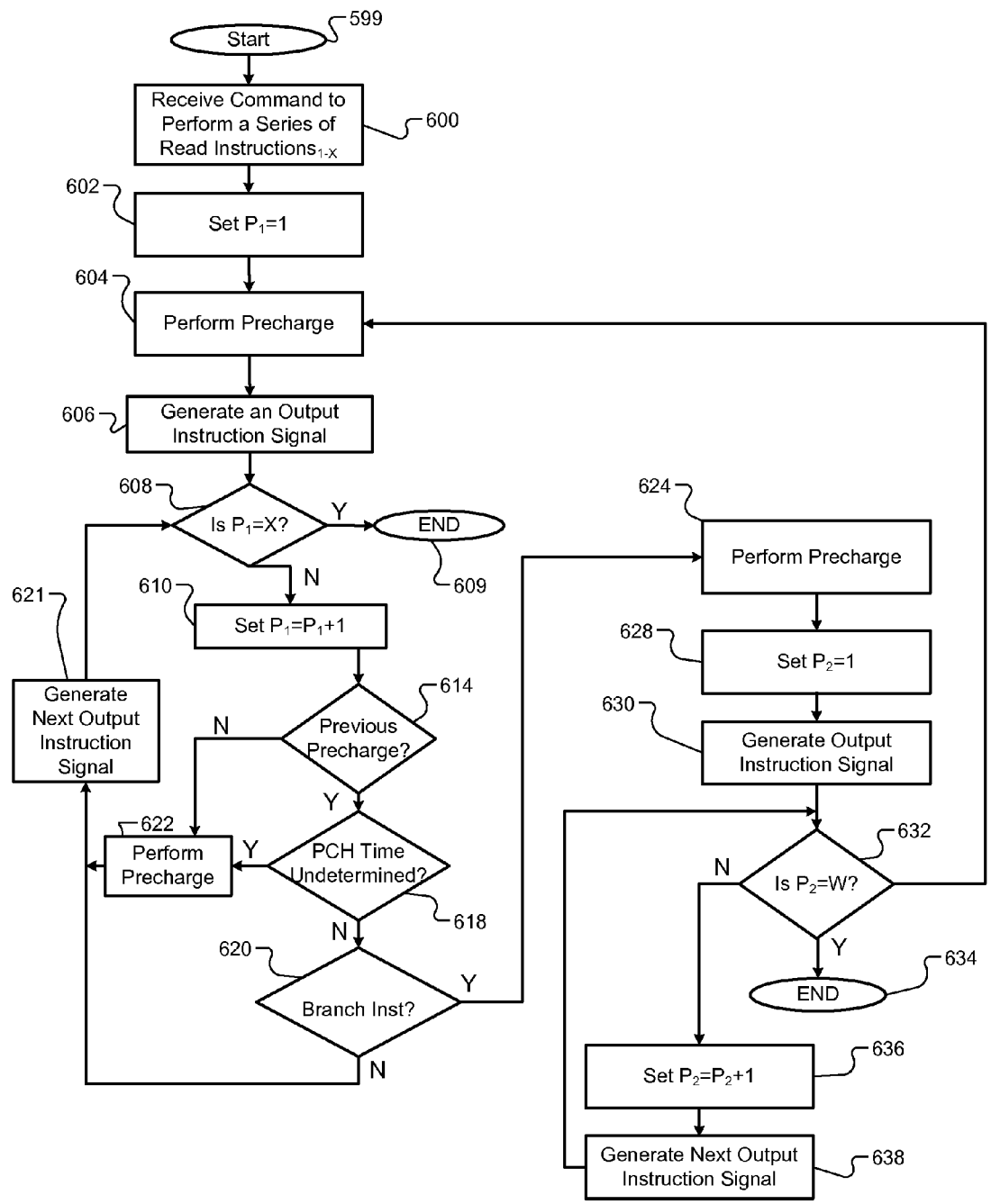
FIG. 11 is a logic flow diagram illustrating precharging method in accordance with the present disclosure.

Referring now to FIG. 11, a precharging method is shown. The following steps 600-622 may be performed when a processor is operating in a sequential read mode. The method may begin at step 599.

In step 600, a read command is received and/or generated to perform a series of read instructions$_{1-X}$. The instructions$_{1-X}$ may be associated with a single word line 152$_1$. In step 602, a program counter value P$_1$ is set equal to 1. In step 604, a precharge is formed on bit lines associated with the word line. In step 606, an output instruction signal is generated based on the precharge of step 604. The output instruction signal may be generated based on a read of one of the instructions$_{1-X}$.

By reading the instructions$_{1-X}$, the processor executes a program. The instructions are received from the processor memory and are generally performed in a sequential order. In processing the instructions$_{1-X}$, a program counter, such as a program counter that stores the program counter value P$_1$, may be used to track a current position in the program. The processor determines tasks to perform based on the instructions$_{1-X}$. The instructions$_{1-X}$ may include branch instructions. When a branch instruction is received, the processor may be directed to read from cells along a different word line than previously asserted, such as the word line 152$_Y$. Thus, the program counter instead of being incremented to the next sequential instruction may be changed to point to an instruction some where else in the program or another program counter may be used.

In step 608, when the program counter value P$_1$ is equal to the number of instructions X, control ends at step 609. When the program counter value P$_1$ is less than the number of read instructions X, control proceeds to step 610. In step 610, control increments the program counter value P$_1$.

The following steps 614-620 may be performed during the same time period and/or in parallel. In step 614, control checks whether a precharge flag is set. The precharge flag may indicate that a previous precharge has been performed, such as the precharge of step 604. When a previous precharge has not been performed control may proceed to step 622, otherwise control may proceed to step 618.

In step 618, control determines whether timing of a previous precharge is undetermined or improper. When timing of a previous precharge is undetermined or improper, control proceeds to step 622, otherwise control may proceed to step 620.

In step 620, control determines whether a branch instruction is received to read another set of instructions$_{1-W}$. When the branch instruction is received, control may proceed to step 624, otherwise control may proceed to step 621.

Figure 12:
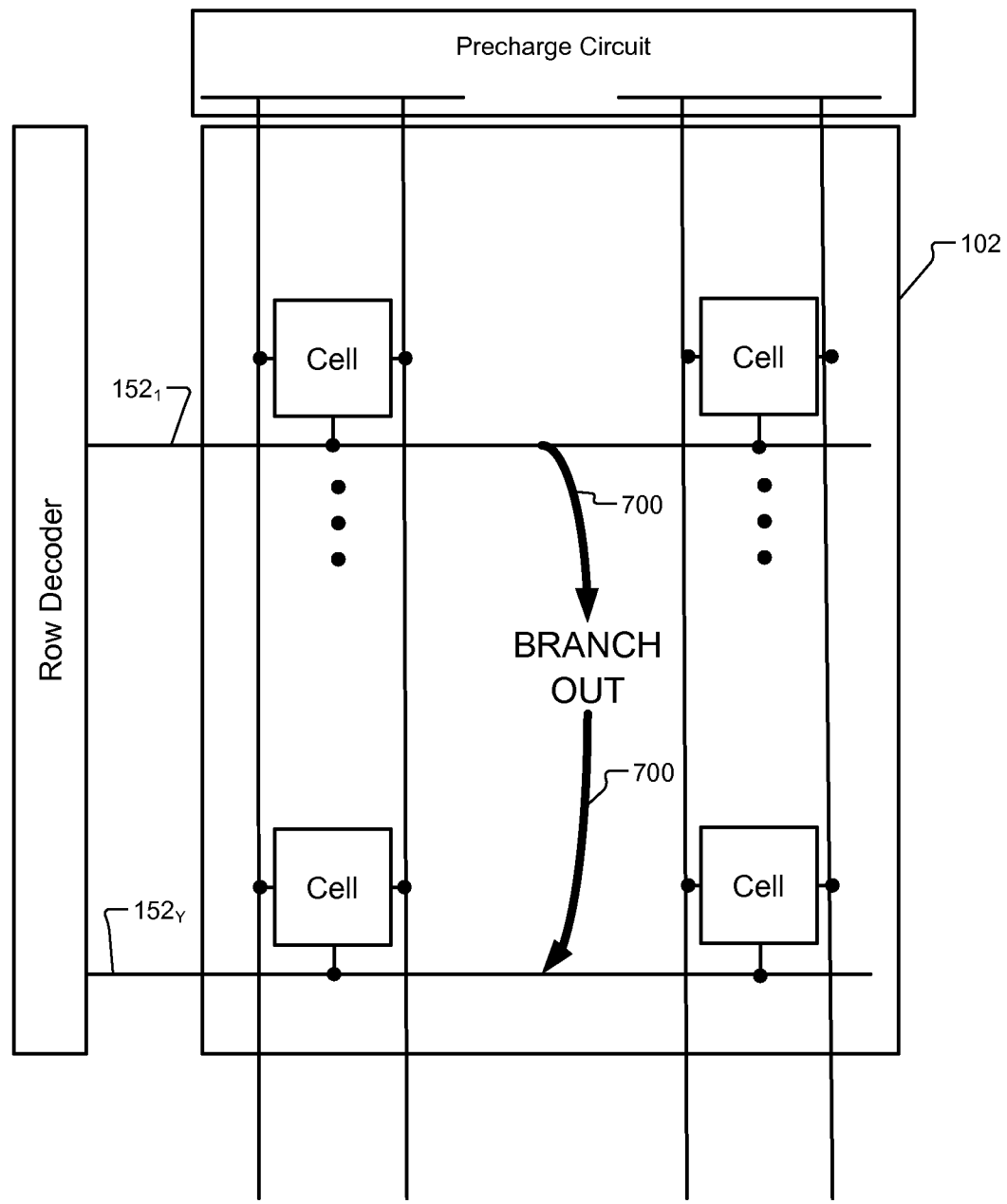
FIG. 12 is a block and schematic diagram of a portion of a memory of FIG. 4.

When executing the branch instruction, the processor may branch out of a current set of instructions$_{1-X}$ to perform other instructions, such as instructions$_{1-W}$. Thus, the processor may cease performing a sequential read in association with a current word line 152$_1$ and initiate another sequential read in association with another word line 152$_Y$. In FIG. 12, a portion of the memory 102 is shown. The set of instructions$_{1-W}$ may be associated with the word line 152$_Y$, whereas the set of instructions$_{1-X}$ may be associated with the word line 152$_1$. Branch out arrows 700 are shown to indicate that a branch instruction has been generated and/or received and that cells along a different word line are to be read. Performance of the instructions$_{1-W}$ is provided by steps 624-638.

For example only, when a branch instruction is generated and control is directed to a "do loop", a sequential read may be interrupted and multiple precharge events may be performed. A "do loop" refers to a set of instructions that are repeatedly performed. When performing a branch instruction, the processor may jump to a set of instructions and execute the set of instructions once or repeatedly. The processor after performing the set of instructions may continue on in the program or return to an instruction sequentially following the branch instruction. A return instruction may be received that directs the processor to return to the instruction following the branch instruction. The multiple precharge events may be performed before the full length of the original sequential read is completed.

Due to the reception of the branch instruction another precharge is performed in step 624. As a default when control does not have knowledge of a precharge and/or when a branch instruction has been generated, control may perform a precharge.

In step 621, control generates another output instruction signal. The output instruction signal may be based on the precharge of step 604 or another precharge. In step 624, control performs a precharge on the bit lines. The precharge is performed for access to the set of instructions$_{1-W}$.

In step 628, control sets a program counter value P$_2$ equal to 1. In step 630, control generates an output instruction signal associated with the instructions$_{1-W}$.

In step 632, when the program counter value P$_2$ is equal to the number of instructions W, control ends at step 634 or returns to step 604 when continuing on with the instructions$_{1-X}$. When the program counter value P$_2$ is less than the number of read instructions W, control proceeds to step 636. In step 636, control increments the program counter value P$_2$.

In step 638, control generates another output instruction signal. The output instruction signal may be based on the precharge of step 626 or another precharge. Control may repeat and/or perform steps 614-620 during the reading of instructions$_{1-W}$.

Figure 13:
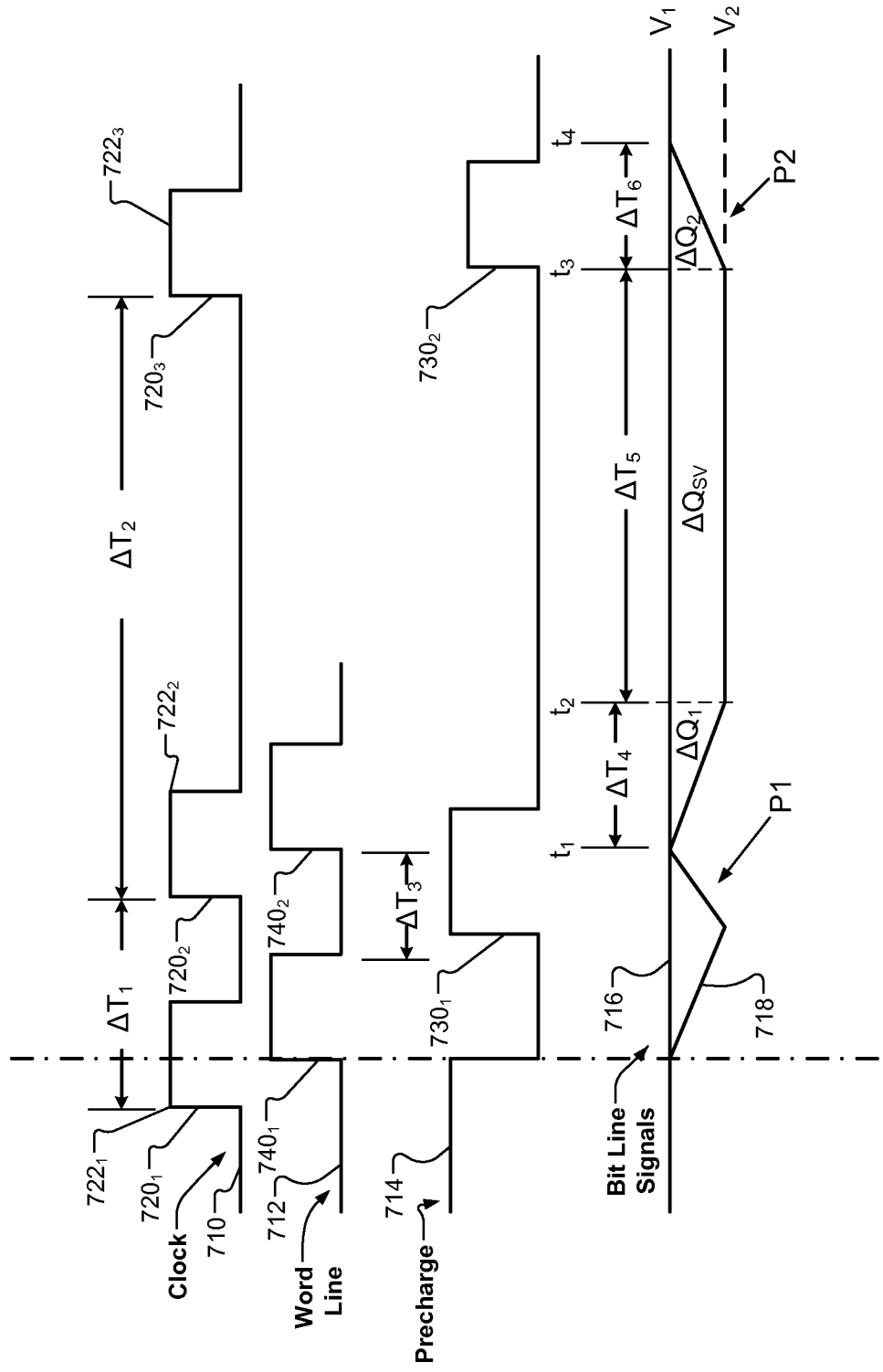
FIG. 13 is a is a signal timing diagram illustrating delayed precharging of bit lines of a processor memory.

Referring now to FIG. 13, a signal timing diagram illustrating delayed precharging of bit lines of a processor memory is shown. The precharge of bit line signals may occur at various times and conditions. Additional precharging may occur during low processor clock rates. When the clock rate is slow or reduced, power consumption is decreased. However, a period between precharge events increases with a decrease in clock rates. When slowing the clock rate to reduce power, control may operate in a discrete read mode, perform additional precharging and/or repeat assertion of the word line associated with the current word.

When the clock rate is reduced, precharging may be delayed to reduce leakage. When the bit lines are fully precharged, leakage may be at a maximum rate. After a precharge event, the amount and rate of leakage decreases.

The delay in precharging may occur for a predetermined period of time. When the clock rate increases, control may return to normal precharge timing. Also, precharging may be performed in time close to and before the generation of a word line signal. This maximizes the time between precharges and decreases power consumption. In other words, power consumption is reduced by delaying a precharge until just before the generation of a word line signal.

FIG. 13 provides an example of when the clock rate is reduced. A clock signal 710, a word line signal 712, a precharge signal 714, and bit line signals 716 and 718 are shown. The rate of the clock signal 710 changes from a high rate to a low rate, as shown by the increase in time between rising edges $720_{1-3}$ of the clock signal 710. $\Delta T_1$ represents the time period between first and second clock pulses $722_1$ and $722_2$ of the clock signal 710. $\Delta T_2$ represents the time period between second and third clock pulses $722_2$ and $722_3$ of the clock signal 710. $\Delta T_2$ is greater than $\Delta T_1$.

During the time period $\Delta T_2$, the processor may refrain from precharging. This delay in precharging reduces leakage in memory cells of the processor memory. The leakage may refer to the amount of current that leaks through transistors, such as pass-gate and pull-down transistors, in a memory cell between reference potentials, such as Vdd and ground. Reference potentials $V_1$ and $V_2$ are shown for bit lines 716 and 718.

As an example, current may leak through transistors M6 and M3 of FIG. 6 between Vdd and Vss, as indicated by bit line leakage current $i_{BL}$. The leakage current exists when the transistors M6 and M3 are in an OFF state. As the bit line separation increases, the bit line current $i_{BL}$, decreases.

The bit lines 716 and 718 as shown include two precharge events P1 and P2. The first precharge event P1 begins at a first rising edge $730_1$ of the precharge signal 714 and ends at time $t_1$. The second precharge event P2 occurs at a second rising edge $730_2$ of the precharge signal 714 and ends at time $t_4$. The first precharge event P1 occurs when the clock rate is high and the second precharge events P2 occurs when the clock rate is low.

After rising edges, such as rising edges $740_1$ and $740_2$, of the word line signal 712 bit line separation begins. Thus, the bit lines 716, 718 begin to separate at time $t_1$. $\Delta Q_1$ represents charge used during time period $\Delta T_4$, which is time between times $t_1$ and $t_2$, due to leakage. $\Delta Q_2$ represents charge used to precharge the bit lines during time period $\Delta T_6$, which is the time between times t3 and $t_4$. Charges $\Delta Q_1$ and $\Delta Q_2$ are provided by equation 1, where $i_{SC}$ represents transistor saturation current, such as PMOS saturation current for precharge transistors.

$$\Delta Q_1 = \Delta Q_2 = i_{SC} \cdot \Delta T_4 = i_{SC} \cdot \Delta T_6 \quad (1)$$

Instead of precharging at time $t_2$, control refrains from precharging until time $t_3$. Time $t_3$ may be determined based on a predetermined amount of time to precharge the bit lines 716 and 718, the current clock rate and timing of clock pulses, and/or a predetermined time of a next rising edge of a word line signal. When a read access cycle and or a rising edge of a word line signal is anticipated, a precharge may be performed beginning at time $t_3$ as identified by rising edge $730_2$. In other words, the precharge is performed close in time and before the anticipated word line pulse. $\Delta T_5$ represents the time period between times $t_2$ and $t_3$. During the time period $\Delta T_5$, charge $\Delta Q_{SV}$ is saved. However, due to a switching charge $\Delta Q_{Sw}$ associated with a switching precharge device, such as a precharging circuit used to precharge the bit lines 716 and 718, the net charge saved $\Delta Q_N$ is provided by equation 2.

$$\Delta Q_N = \Delta Q_{SV} - \Delta Q_{SW} \quad (2)$$

The switching charge $\Delta Q_{Sw}$ is provided by equation 3, where C is capacitance of the precharging device. The capacitance may also include capacitance of corresponding signal lines.

$$\Delta Q_{SW} = C \cdot Vdd \quad (3)$$

The wireless network devices and systems disclosed herein, may comply with IEEE standards, such as 802.11, 802.11a, 802.11b, 802.11g, 802.11h, 802.11n, 802.16, and 802.20. Also, the implementations disclosed herein may utilize and/or incorporate Bluetooth devices and techniques.

Figure 14:
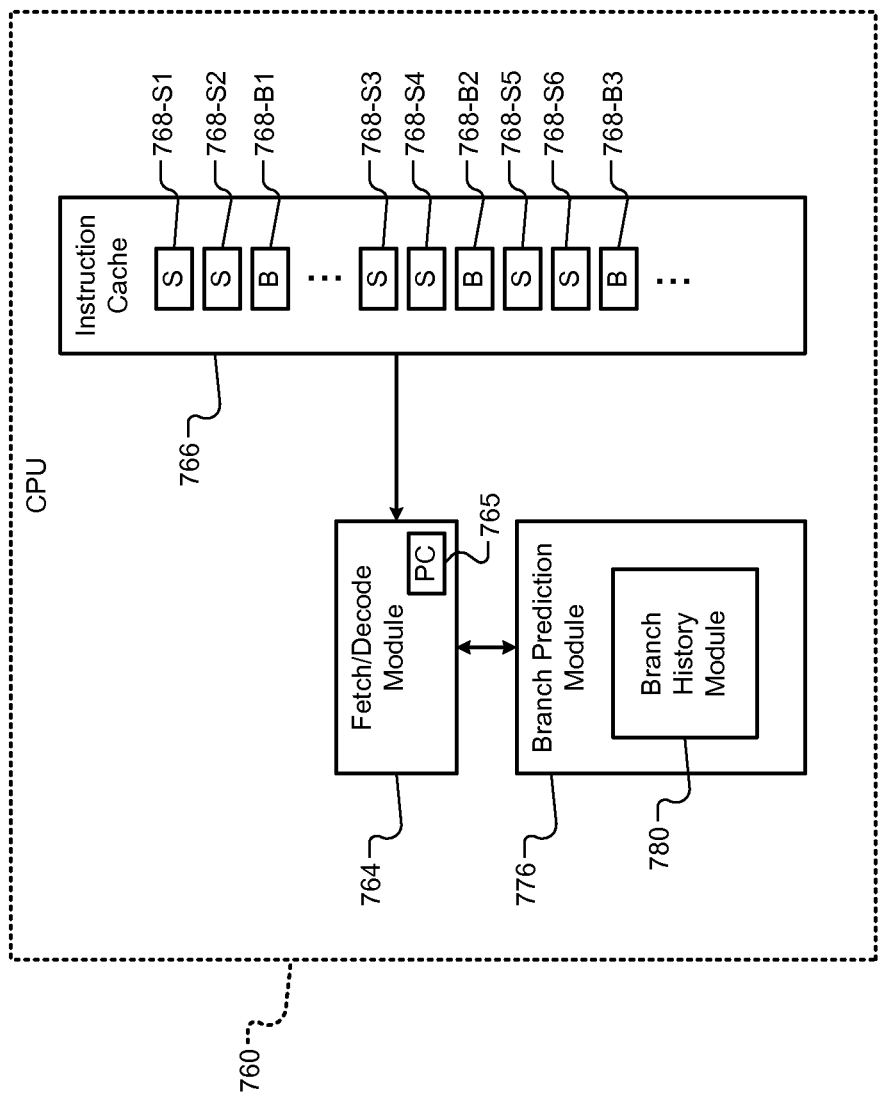
FIG. 14 illustrates a CPU with a branch prediction module in accordance with the present disclosure.

Referring now to FIG. 14, a CPU 760 includes a fetch/decode module 764 that fetches and decodes sequential and branch instructions from memory such as instruction cache 766. Some of the instructions may be pre-fetched and decoded in advance. For example only, the instruction cache 766 includes sequential instructions 768-S1, 768-S2, . . . , and 768-S6 (collectively sequential instructions 768-S). For example only, the instruction cache 766 also includes branch instructions 768-B1, 768-B2, and 768-B3 (collectively branch instructions 768-B). As can be appreciated, branch and sequential instructions may be arranged in any sequence.

The fetch/decode module 765 or another component of the CPU 760 includes a program counter (PC) 765. The program counter 765 keeps track of the location of the next instruction in the instruction memory 766. The CPU 760 further includes a branch prediction module 776 that predicts the outcome of a branch instruction to facilitate the efficiency of pre-fetching and decoding. The branch prediction module 776 may includes a branch history module 780 that stores branch prediction data for branch instructions.

The instructions are typically stored in successive addressable locations within the memory such as the instruction cache 766 of the CPU 760. When processed by the CPU 760, the instructions are fetched from consecutive memory locations and executed. Each time an instruction is fetched from memory, the program counter 765 within the CPU 760 is incremented so that it contains the address of the next instruction in the sequence. Fetching of an instruction, incrementing of the program counter 765, and execution of the instruction continues until a branching instruction is encountered.

The branching instruction, when executed, changes the address in the program counter 765 and causes the flow of control to be altered. For example only, the branch instructions may include conditional or unconditional branches. Example branch instructions include jump, test and jump conditionally (such as if . . . then . . . else or similar), call, return, etc. The jump instruction causes the CPU 760 to unconditionally change the contents of the program counter 765 to a specific value, such as the target address for the instruction where the program is to continue execution.

The test and jump conditionally instruction causes the CPU 760 to test the contents of a status register, compare values such as those in cache, or perform another test and either continue sequential execution or jump to a target address based on the outcome. The call instruction causes the CPU to unconditionally jump to a new target address, but also saves the value of the program counter 765 to allow the CPU 760 to return to the program location. The return instruction causes the CPU 760 to retrieve the value of the program counter that was saved by the last call instruction, and return program flow back to the retrieved instruction address.

Early CPUs were designed to execute only one instruction at a time. For these CPUs, it was not important whether the next instruction was sequential or a branch. More sophisticated CPUs operate on several instructions at the same time, within different blocks or pipeline stages of the CPU. In other words, the CPU may be pipelined and include two or more pipelines stages. As instructions are fetched, they are introduced into one end of the pipeline. The instructions proceed through pipeline stages within the CPU until they complete execution.

In pipelined CPUs, it is often not known whether a branch instruction will alter program flow until it reaches a late stage in the pipeline. By this time, the CPU has already fetched other instructions and is executing them in earlier stages of the pipeline. If a branch causes a change in program flow, all of the instructions in the pipeline that followed the branch must be thrown out. In addition, the instruction specified by the target address of the branch instruction must be fetched. Throwing out the intermediate instructions, and fetching the instruction at the target address creates processing delays.

To alleviate the delay, the branch prediction module 776 predicts the likely outcome of branch instructions, and then fetches subsequent instructions according to the branch prediction. The branch prediction module 776 may include the branch history module 780 that makes predictions about conditional branch instruction outcomes.

For example only, the branch history module 780 may include an array of one or more bits indexed by a branch instruction address or other suitable scheme. Each bit stores one or more prior outcomes of the branch instruction. For example, the bit stores a 1 if the branch was taken the last time it was executed and a 0 if the branch was not taken the last time it was executed. Additional bits may be used to implement more complex criteria such as A out of B or other criteria.

To make a prediction for a branch instruction, the branch prediction module 776 takes the address of the branch instruction and evaluates the contents of the branch history module 780. For the single bit example, the prediction for a given execution of a branch instruction is the outcome of the previous execution of the branch instruction. After the branch instruction executes or is not executed, the branch history module 780 may be updated with the actual branch instruction outcome.

According to the present disclosure, power consumption is reduced by reducing precharging events and/or assertion of the same word line when accessing predicted branch instructions associated with the same word line. In other words when the CPU 760 fetches subsequent instructions in a pipeline processor, the CPU 760 may encounter one or more branch instructions. When the branch instructions are encountered, the branch prediction module 776 uses prediction data associated with the branch instruction to predict whether the branch is likely to be taken or not. Based on the predicted outcome, the CPU loads the corresponding branch instruction and continues with other subsequent instructions. The multimode accessing control module selectively uses either sequential or discrete read modes as described above.

Referring now to FIGS. 15A-15F, various exemplary implementations incorporating the teachings of the present disclosure are shown.

Figure 15A:
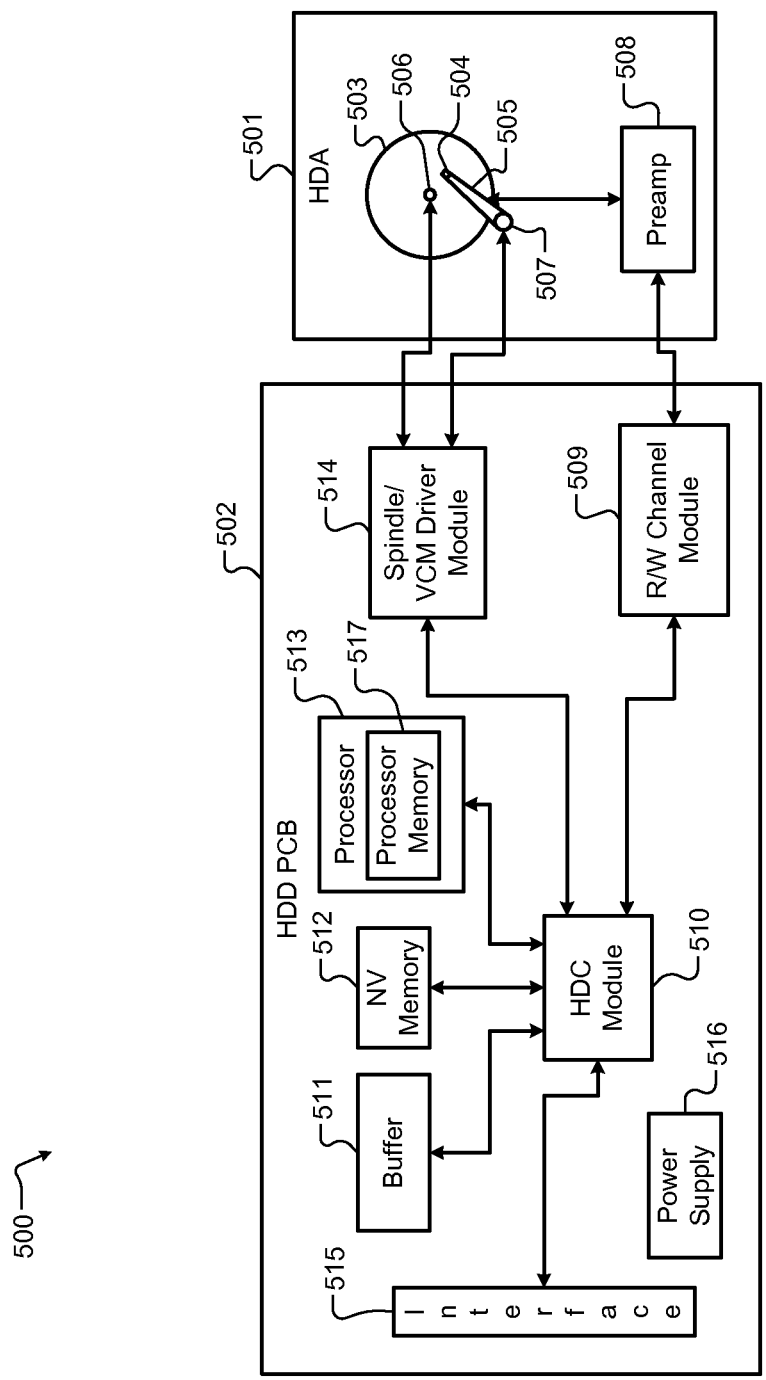
FIG. 15A is a functional block diagram of a hard disk drive.

Referring now to FIG. 15A, the teachings of the disclosure can be implemented in a processor 513 to access memory cells in a processor memory 517 of a hard disk drive (HDD) 500. The HDD 500 includes a hard disk assembly (HDA) 501 and an HDD printed circuit board (PCB) 502. The HDA 501 may include a magnetic medium 503, such as one or more platters that store data, and a read/write device 504. The read/write device 504 may be arranged on an actuator arm 505 and may read and write data on the magnetic medium 503. Additionally, the HDA 501 includes a spindle motor 506 that rotates the magnetic medium 503 and a voice-coil motor (VCM) 507 that actuates the actuator arm 505. A preamplifier device 508 amplifies signals generated by the read/write device 504 during read operations and provides signals to the read/write device 504 during write operations.

The HDD PCB 502 includes a read/write channel module (hereinafter, "read channel") 509, a hard disk controller (HDC) module 510, a buffer 511, nonvolatile memory 512, the processor 513, and a spindle/VCM driver module 514. The read channel 509 processes data received from and transmitted to the preamplifier device 508. The HDC module 510 controls components of the HDA 501 and communicates with an external device (not shown) via an I/O interface 515. The external device may include a computer, a multimedia device, a mobile computing device, etc. The I/O interface 515 may include wireline and/or wireless communication links.

The HDC module 510 may receive data from the HDA 501, the read channel 509, the buffer 511, nonvolatile memory 512, the processor 513, the spindle/VCM driver module 514, and/or the I/O interface 515. The processor 513 may process the data, including encoding, decoding, filtering, and/or formatting. The processed data may be output to the HDA 501, the read channel 509, the buffer 511, nonvolatile memory 512, the processor 513, the spindle/VCM driver module 514, and/or the I/O interface 515.

The HDC module 510 may use the buffer 511 and/or nonvolatile memory 512 to store data related to the control and operation of the HDD 500. The buffer 511 may include DRAM, SDRAM, etc. The nonvolatile memory 512 may include flash memory (including NAND and NOR flash memory), phase change memory, magnetic RAM, or multi-state memory, in which each memory cell has more than two states. The spindle/VCM driver module 514 controls the spindle motor 506 and the VCM 507. The HDD PCB 502 includes a power supply 516 that provides power to the components of the HDD 500.

Figure 15B:
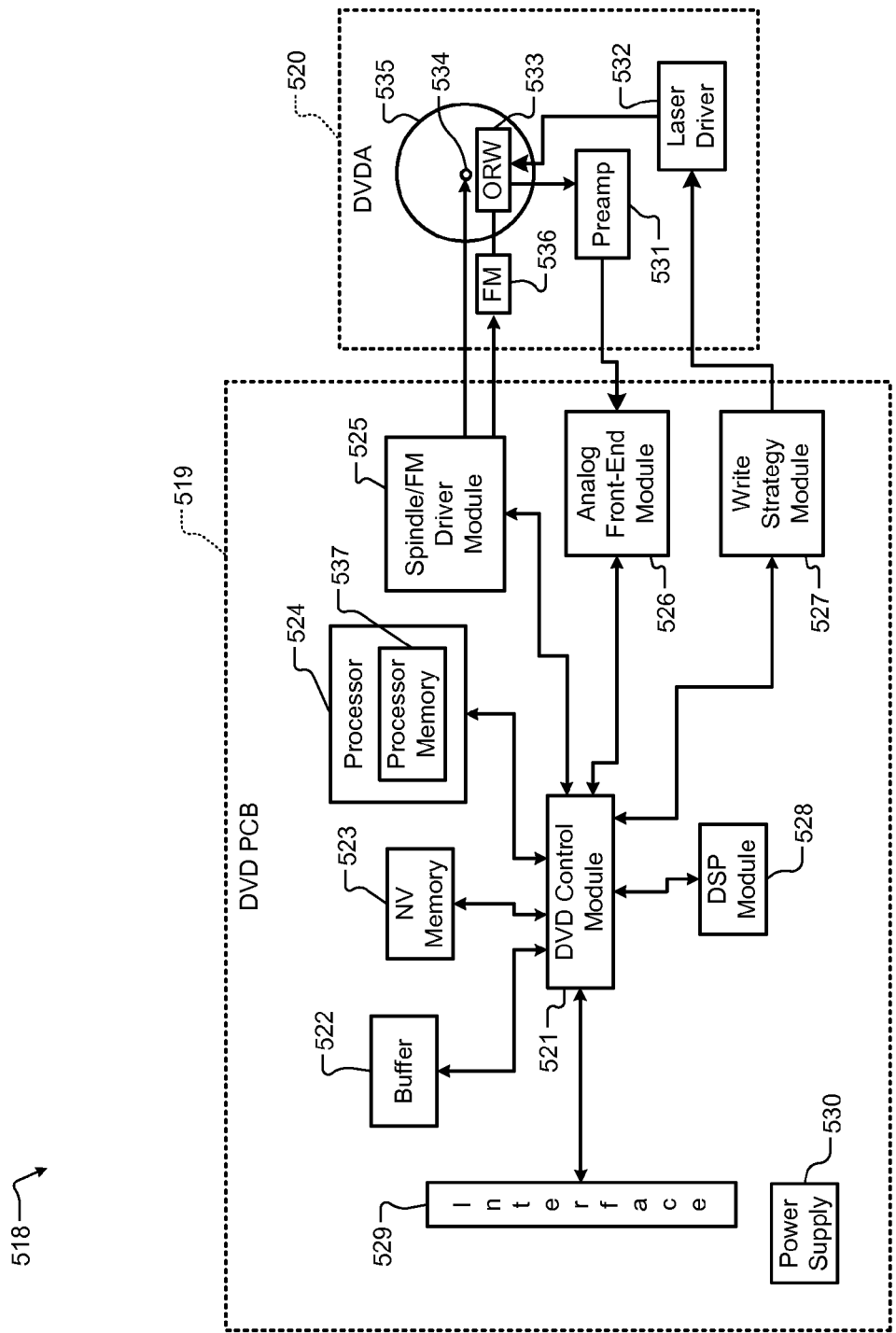
FIG. 15B is a functional block diagram of a DVD drive.

Referring now to FIG. 15B, the teachings of the disclosure can be implemented in a processor 524 to access memory cells of a processor memory 537 of a DVD drive 518 or of a CD drive (not shown). The DVD drive 518 includes a DVD PCB 519 and a DVD assembly (DVDA) 520. The DVD PCB 519 includes a DVD control module 521, a buffer 522, nonvolatile memory 523, the processor 524, a spindle/FM (feed motor) driver module 525, an analog front-end module 526, a write strategy module 527, and a DSP module 528.

The DVD control module 521 controls components of the DVDA 520 and communicates with an external device (not shown) via an I/O interface 529. The external device may include a computer, a multimedia device, a mobile computing device, etc. The I/O interface 529 may include wireline and/or wireless communication links.

The DVD control module 521 may receive data from the buffer 522, nonvolatile memory 523, the processor 524, the spindle/FM driver module 525, the analog front-end module 526, the write strategy module 527, the DSP module 528, and/or the I/O interface 529. The processor 524 may process the data, including encoding, decoding, filtering, and/or formatting. The DSP module 528 performs signal processing, such as video and/or audio coding/decoding. The processed data may be output to the buffer 522, nonvolatile memory 523, the processor 524, the spindle/FM driver module 525, the analog front-end module 526, the write strategy module 527, the DSP module 528, and/or the I/O interface 529.

The DVD control module 521 may use the buffer 522 and/or nonvolatile memory 523 to store data related to the control and operation of the DVD drive 518. The buffer 522 may include DRAM, SDRAM, etc. The nonvolatile memory 523 may include flash memory (including NAND and NOR flash memory), phase change memory, magnetic RAM, or multi-state memory, in which each memory cell has more than two states. The DVD PCB 519 includes a power supply 530 that provides power to the components of the DVD drive 518.

The DVDA 520 may include a preamplifier device 531, a laser driver 532, and an optical device 533, which may be an optical read/write (ORW) device or an optical read-only (OR) device. A spindle motor 534 rotates an optical storage medium 535, and a feed motor 536 actuates the optical device 533 relative to the optical storage medium 535.

When reading data from the optical storage medium 535, the laser driver provides a read power to the optical device 533. The optical device 533 detects data from the optical storage medium 535, and transmits the data to the preamplifier device 531. The analog front-end module 526 receives data from the preamplifier device 531 and performs such functions as filtering and A/D conversion. To write to the optical storage medium 535, the write strategy module 527 transmits power level and timing data to the laser driver 532. The laser driver 532 controls the optical device 533 to write data to the optical storage medium 535.

Figure 15D:
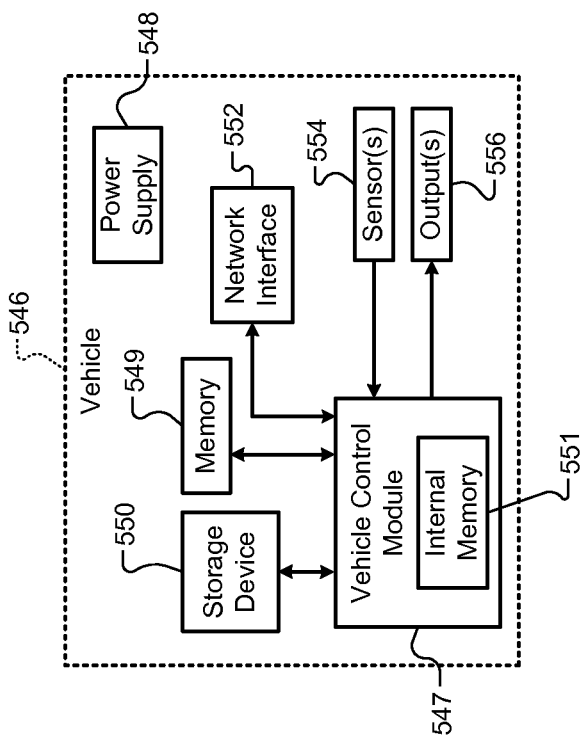
FIG. 15D is a functional block diagram of a vehicle control system.
Figure 15C:
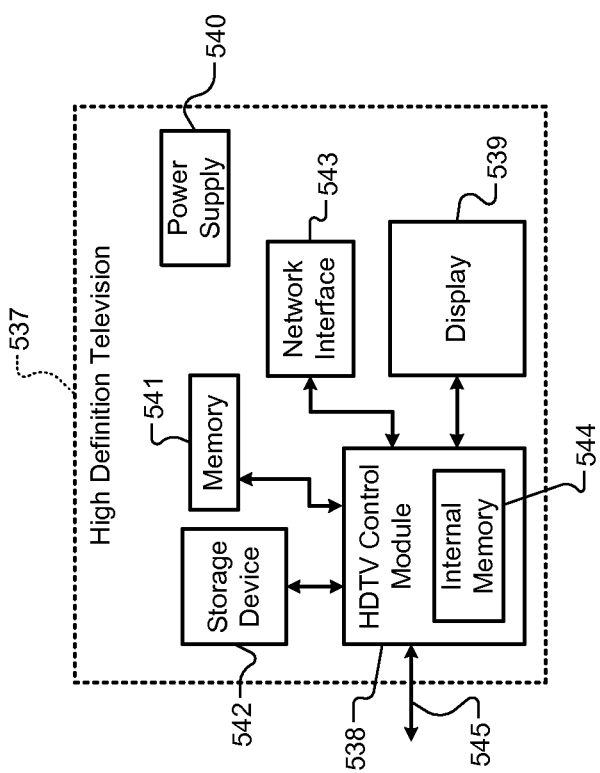
FIG. 15C is a functional block diagram of a high definition television.

Referring now to FIG. 15C, the teachings of the disclosure can be implemented in a HDTV control module 538 to access memory cells of an internal memory 544 of a high definition television (HDTV) 537. The HDTV 537 includes the HDTV control module 538, a display 539, a power supply 540, memory 541, a storage device 542, a network interface 543, and an external interface 545. If the network interface 543 includes a wireless local area network interface, an antenna (not shown) may be included.

The HDTV 537 can receive input signals from the network interface 543 and/or the external interface 545, which can send and receive data via cable, broadband Internet, and/or satellite. The HDTV control module 538 may process the input signals, including encoding, decoding, filtering, and/or formatting, and generate output signals. The output signals may be communicated to one or more of the display 539, memory 541, the storage device 542, the network interface 543, and the external interface 545.

Memory 541 may include random access memory (RAM) and/or nonvolatile memory such as flash memory, phase change memory, or multi-state memory, in which each memory cell has more than two states. The storage device 542 may include an optical storage drive, such as a DVD drive, and/or a hard disk drive (HDD). The HDTV control module 538 communicates externally via the network interface 543 and/or the external interface 545. The power supply 540 provides power to the components of the HDTV 537.

Referring now to FIG. 15D, the teachings of the disclosure may be implemented in a vehicle control module 547 to access memory cells of an internal memory 551 of a vehicle 546. The vehicle 546 may include the vehicle control module 547, a power supply 548, memory 549, a storage device 550, and a network interface 552. If the network interface 552 includes a wireless local area network interface, an antenna (not shown) may be included. The vehicle control module 547 may be a powertrain control system, a body control system, an entertainment control system, an anti-lock braking system (ABS), a navigation system, a telematics system, a lane departure system, an adaptive cruise control system, etc.

The vehicle control module 547 may communicate with one or more sensors 554 and generate one or more output signals 556. The sensors 554 may include temperature sensors, acceleration sensors, pressure sensors, rotational sensors, airflow sensors, etc. The output signals 556 may control engine operating parameters, transmission operating parameters, suspension parameters, etc.

The power supply 548 provides power to the components of the vehicle 546. The vehicle control module 547 may store data in memory 549 and/or the storage device 550. Memory 549 may include random access memory (RAM) and/or nonvolatile memory such as flash memory, phase change memory, or multi-state memory, in which each memory cell has more than two states. The storage device 550 may include an optical storage drive, such as a DVD drive, and/or a hard disk drive (HDD). The vehicle control module 547 may communicate externally using the network interface 552.

Figure 15F:
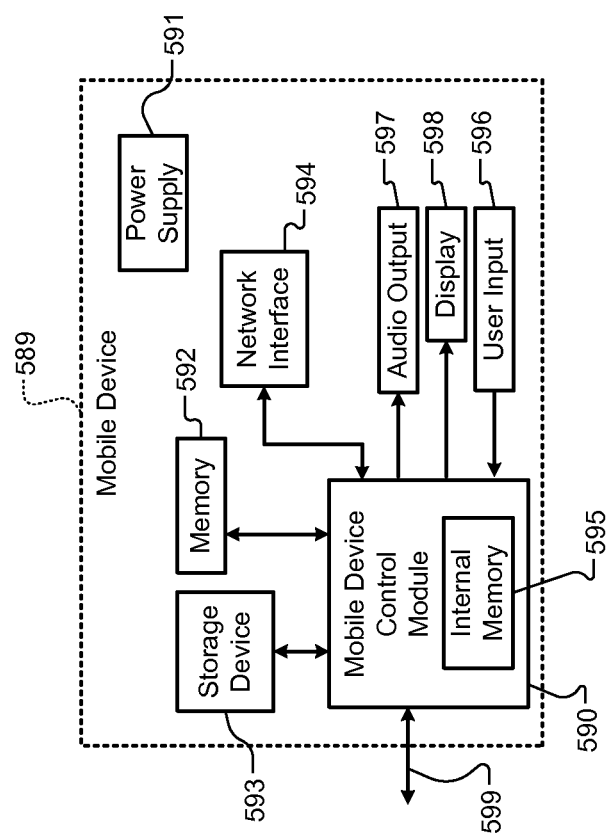
FIG. 15F is a functional block diagram of a mobile device.
Figure 15E:
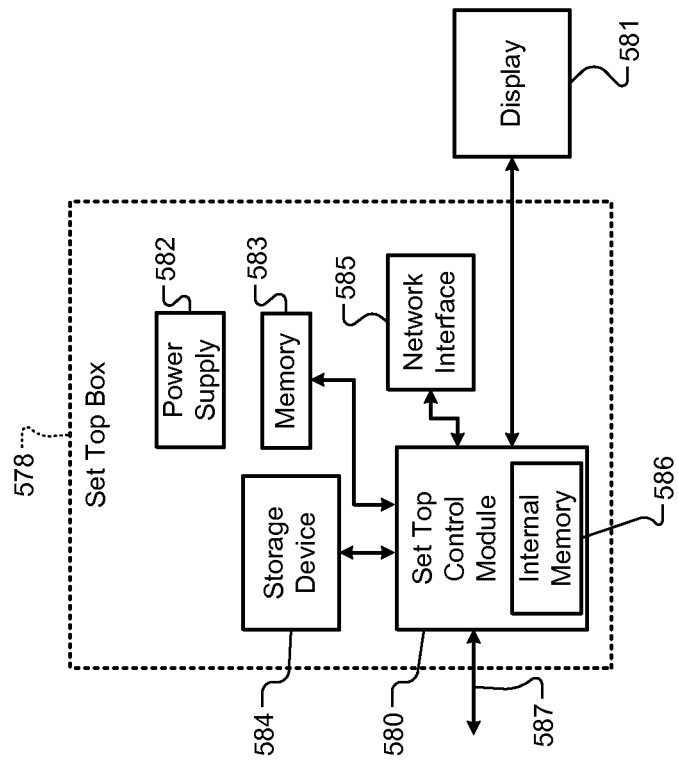
FIG. 15E is a functional block diagram of a set top box.

Referring now to FIG. 15E, the teachings of the disclosure can be implemented in a set top control module 580 to access memory cells of an internal memory 586 of a set top box 578. The set top box 578 includes the set top control module 580, a display 581, a power supply 582, memory 583, a storage device 584, and a network interface 585. If the network interface 585 includes a wireless local area network interface, an antenna (not shown) may be included.

The set top control module 580 may receive input signals from the network interface 585 and an external interface 587, which can send and receive data via cable, broadband Internet, and/or satellite. The set top control module 580 may process signals, including encoding, decoding, filtering, and/or formatting, and generate output signals. The output signals may include audio and/or video signals in standard and/or high definition formats. The output signals may be communicated to the network interface 585 and/or to the display 581. The display 581 may include a television, a projector, and/or a monitor.

The power supply 582 provides power to the components of the set top box 578. Memory 583 may include random access memory (RAM) and/or nonvolatile memory such as flash memory, phase change memory, or multi-state memory, in which each memory cell has more than two states. The storage device 584 may include an optical storage drive, such as a DVD drive, and/or a hard disk drive (HDD).

Referring now to FIG. 15F, the teachings of the disclosure can be implemented in a mobile device control module 590 to access memory cells of an internal memory 595 of a mobile device 589. The mobile device 589 may include the mobile device control module 590, a power supply 591, memory 592, a storage device 593, a network interface 594, and an external interface 599. If the network interface 594 includes a wireless local area network interface, an antenna (not shown) may be included.

The mobile device control module 590 may receive input signals from the network interface 594 and/or the external interface 599. The external interface 599 may include USB, infrared, and/or Ethernet. The input signals may include compressed audio and/or video, and may be compliant with the MP3 format. Additionally, the mobile device control module 590 may receive input from a user input 596 such as a keypad, touchpad, or individual buttons. The mobile device control module 590 may process input signals, including encoding, decoding, filtering, and/or formatting, and generate output signals.

The mobile device control module 590 may output audio signals to an audio output 597 and video signals to a display 598. The audio output 597 may include a speaker and/or an output jack. The display 598 may present a graphical user interface, which may include menus, icons, etc. The power supply 591 provides power to the components of the mobile device 589. Memory 592 may include random access memory (RAM) and/or nonvolatile memory such as flash memory, phase change memory, or multi-state memory, in which each memory cell has more than two states. The storage device 593 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A processor comprising:
a memory comprising an array of memory cells;
a control module configured to (i) generate a clock signal at a first rate, (ii) reduce the first rate of the clock signal to a second rate for a predetermined period, and (iii) adjust the clock signal from the second rate back to the first rate at an end of the predetermined period;
a precharge circuit configured to (i) based on the clock signal at the first rate, precharge first bit lines connected to memory cells in a first row of the array of memory cells, (ii) based on the clock signal at the second rate, refrain from precharging the first bit lines during the predetermined period, and (iii) precharge the first bit lines subsequent to the end of the predetermined period; and
an amplifier module configured to (i) based on the clock signal at the first rate, access first instructions stored in the first row of the array of memory cells, and (ii) based on the clock signal at the second rate, access second instructions stored in the first row of the array of memory cells or in a second row of the array of memory cells.

2. The processor of claim 1, wherein:
the precharge circuit is configured to (i) during a first precharge event, precharge the first bit lines based on the clock signal at the first rate to provide a first amount of bit line separation for accessing the first instructions, and (ii) during a second precharge event, precharge the first bit lines based on the clock signal at the second rate to provide a second amount of bit line separation for accessing the second instructions; and
the amplifier module is configured to
access the first instructions (i) subsequent to the first precharge event, and (ii) prior to the second precharge event, and
access the second instructions subsequent to the second precharge event.

3. The processor of claim 2, wherein:
the first precharge event is performed a first period after a previous precharge event;
the second precharge event is performed a second period after the first precharge event;
the second period is longer than the first period;
the first precharge event is performed consecutively after the previous precharge event; and
the second precharge event is performed consecutively after the first precharge event.

4. The processor of claim 2, wherein:
during the first precharge event, a first voltage potential of a first one of the first bit lines is equal to a second voltage potential of a second one of the first bit lines;
subsequent to the first precharge event, a difference between the first voltage potential and the second voltage potential increases;
the first voltage potential remains different than the second voltage potential for a separation period between the first precharge event and the second precharge event; and
a duration of the separation period is based on the second rate.

5. The processor of claim 2, wherein:
the first bit lines include a first line and a second line;
during the first precharge event, an amount of bit line separation between the first line and the second line is zero;
the amount of bit line separation between the first line and the second line is greater than zero subsequent to the first precharge event;
the amount of bit line separation between the first line and the second line remains greater than zero for a separation period between the first precharge event and the second precharge event;
a duration of the separation period is based on the second rate; and
the amount of bit line separation between the first line and the second line is equal to zero during the second precharge event.

6. The processor of claim 2, wherein the control module is configured to reduce the first rate of the clock signal to the second rate during the first precharge event.

7. The processor of claim 1, wherein the precharge circuit is configured to:
based on the clock signal at the first rate, precharge the first bit lines during a first cycle of the clock signal;
refrain from precharging the first bit lines during a second cycle of the clock signal, wherein the second cycle occurs consecutively after the first cycle of the clock signal; and
based on the clock signal at the second rate, precharge the first bit lines during a third cycle of the clock signal, wherein the third cycle of the clock signal occurs consecutively after the second cycle of the clock signal.

8. The processor of claim 7, wherein the first rate of the clock signal is reduced to the second rate during the second cycle of the clock signal.

9. The processor of claim 1, further comprising a decoder configured to (i) generate a first pulse on a word line signal to access the first instructions, and (ii) generate a second pulse on the word line signal to access second instructions,
wherein the amplifier module is configured to (i) access the first instructions based on the first pulse of the word line signal, and (ii) access the second instructions based on the second pulse of the word line signal.

10. The processor of claim 9, wherein:
the first pulse of the word line signal is generated during a first cycle of the clock signal;
the second pulse of the word line signal is generated during a second cycle of the clock signal; and
the second cycle of the clock signal occurs consecutively after the first cycle of the clock signal.

11. The processor of claim 9, wherein the precharge circuit is configured to:
precharge the first bit lines to access the first instructions a first period after a first falling edge of the first pulse of the word line signal; and
precharge the first bit lines to access the second instructions a second period after a second falling edge of the second pulse of the word line signal, wherein a first cycle of the word line signal includes the first pulse of the word line signal, a second cycle of the word line signal includes the second pulse of the word line signal, the second cycle is generated consecutively after the first cycle, and the second period is longer than the first period.

12. The processor of claim 9, wherein:

the word line signal defines a period to increase separation between two of the first bit lines; and the decoder is configured to, based on a predetermined number of read cycles, set the period defined to increase separation between the two of the first bit lines.

13. The processor of claim 9, wherein:

the control module is configured to generate a third pulse on the word line signal to access third instructions stored in the second row of the array of memory cells;

the precharge circuit is configured to, prior to the amplifier module accessing the third instructions, precharge second bit lines connected to memory cells in the second row of the array of the memory cells, wherein the second bit lines are different than the first bit lines; and the amplifier module is configured to access the third instructions based on the third pulse.

14. The processor of claim 9, wherein the control module is configured to:

determine bit line separation based on a number of access cycles to be performed along the word line; and precharge the first bit lines to provide bit line separation when accessing the first instructions and the second instructions.

15. A method comprising:

generating a clock signal at a first rate;

reducing the first rate of the clock signal to a second rate for a predetermined period;

adjusting the clock signal from the second rate back to the first rate at an end of the predetermined period;

based on the clock signal at the first rate, precharging first bit lines connected to memory cells in a first row of an array of memory cells;

based on the clock signal at the second rate, refraining from precharging the first bit lines during the predetermined period;

precharging the first bit lines subsequent to the end of the predetermined period;

based on the clock signal at the first rate, accessing first instructions stored in the first row of the array of memory cells; and based on the clock signal at the second rate, accessing second instructions stored in the first row of the array of memory cells or in a second row of the array of memory cells.

16. The method of claim 15, further comprising:

during a first precharge event, precharging the first bit lines based on the clock signal at the first rate to provide a first amount of bit line separation for accessing the first instructions;

during a second precharge event, precharging the first bit lines based on the clock signal at the second rate to provide a second amount of bit line separation for accessing the second instructions;

accessing the first instructions (i) subsequent to the first precharge event, and (ii) prior to the second precharge event; and accessing the second instructions subsequent to the second precharge event.

17. The method of claim 16, wherein:

the first bit lines include a first line and a second line;

during the first precharge event, an amount of bit line separation between the first line and the second line is zero;

the amount of bit line separation between the first line and the second line is greater than zero subsequent to the first precharge event;

the amount of bit line separation between the first line and the second line remains greater than zero for a separation period between the first precharge event and the second precharge event;

a duration of the separation period is based on the second rate; and the amount of bit line separation between the first line and the second line is equal to zero during the second precharge event.

18. The method of claim 15, further comprising:

based on the clock signal at the first rate, precharging the first bit lines during a first cycle of the clock signal;

refraining from precharging the first bit lines during a second cycle of the clock signal, wherein the second cycle occurs consecutively after the first cycle of the clock signal; and based on the clock signal at the second rate, precharging the first bit lines during a third cycle of the clock signal, wherein the third cycle of the clock signal occurs consecutively after the second cycle of the clock signal.

19. The method of claim 15, further comprising:

generating a first pulse on a word line signal to access the first instructions;

generating a second pulse on the word line signal to access second instructions;

accessing the first instructions based on the first pulse of the word line signal; and accessing the second instructions based on the second pulse of the word line signal.

20. The method of claim 19, further comprising:

precharging the first bit lines to access the first instructions a first period after a first falling edge of the first pulse of the word line signal; and precharging the first bit lines to access the second instructions a second period after a second falling edge of the second pulse of the word line signal, wherein a first cycle of the word line signal includes the first pulse of the word line signal, a second cycle of the word line signal includes the second pulse of the word line signal, the second cycle is generated consecutively after the first cycle, and the second period is longer than the first period.

* * * * *